(12) United States Patent
Rashed et al.

(10) Patent No.: US 8,618,607 B1
(45) Date of Patent: Dec. 31, 2013

(54) SEMICONDUCTOR DEVICES FORMED ON A CONTINUOUS ACTIVE REGION WITH AN ISOLATING CONDUCTIVE STRUCTURE POSITIONED BETWEEN SUCH SEMICONDUCTOR DEVICES, AND METHODS OF MAKING SAME

(75) Inventors: Mahbub Rashed, Santa Clara, CA (US); David Doman, Austin, TX (US); Marc Tarabbia, Pleasant Valley, NY (US); Irene Lin, Los Altos Hills, CA (US); Jeff Kim, San Jose, CA (US); Chinh Nguyen, Austin, TX (US); Steve Soss, Cornwall, NY (US); Scott Johnson, Wappingers Falls, NY (US); Subramani Kengeri, San Jose, CA (US); Suresh Venkatesan, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/539,830

(22) Filed: Jul. 2, 2012

(51) Int. Cl.
    *H01L 21/02* (2006.01)
(52) U.S. Cl.
    USPC .... 257/359; 257/369; 257/379; 257/E21.602; 257/E21.656; 257/E23.144; 257/E23.152; 257/E27.029; 257/E27.081; 257/E29.226; 257/E29.276

(58) Field of Classification Search
    USPC ............ 257/204, 359, 369, 379, 532, 536, 257/E21.564, 568, 602, 656, 23.144, 152, 257/27.024, 26, 81, 97, 98, 107, 29.226, 257/276
    See application file for complete search history.

(56) References Cited

U.S. PATENT DOCUMENTS

| | | | | |
|---|---|---|---|---|
| 5,536,955 | A * | 7/1996 | Ali | 257/204 |
| 6,147,857 | A * | 11/2000 | Worley et al. | 361/301.2 |
| 6,558,998 | B2 * | 5/2003 | Belleville et al. | 438/210 |
| 7,189,602 | B2 * | 3/2007 | Jiang et al. | 438/142 |
| 7,282,803 | B2 * | 10/2007 | Cathelin et al. | 257/758 |
| 7,960,269 | B2 * | 6/2011 | Lo et al. | 438/598 |
| 8,421,158 | B2 * | 4/2013 | Lin | 257/379 |
| 8,453,094 | B2 * | 5/2013 | Kornachuk et al. | 716/126 |
| 8,471,391 | B2 * | 6/2013 | Fox et al. | 257/776 |
| 8,492,900 | B2 * | 7/2013 | Lin et al. | 257/773 |
| 2002/0063291 | A1 * | 5/2002 | Brown et al. | 257/359 |
| 2009/0101940 | A1 * | 4/2009 | Barrows et al. | 257/204 |

\* cited by examiner

*Primary Examiner* — Michael Lebentritt
(74) *Attorney, Agent, or Firm* — Williams, Morgan & Amerson, P.C.

(57) ABSTRACT

One illustrative device disclosed herein includes a continuous active region defined in a semiconducting substrate, first and second transistors formed in and above the continuous active region, each of the first and second transistors comprising a plurality of doped regions formed in the continuous active region, a conductive isolating electrode positioned above the continuous active region between the first and second transistors and a power rail conductively coupled to the conductive isolating electrode.

36 Claims, 23 Drawing Sheets

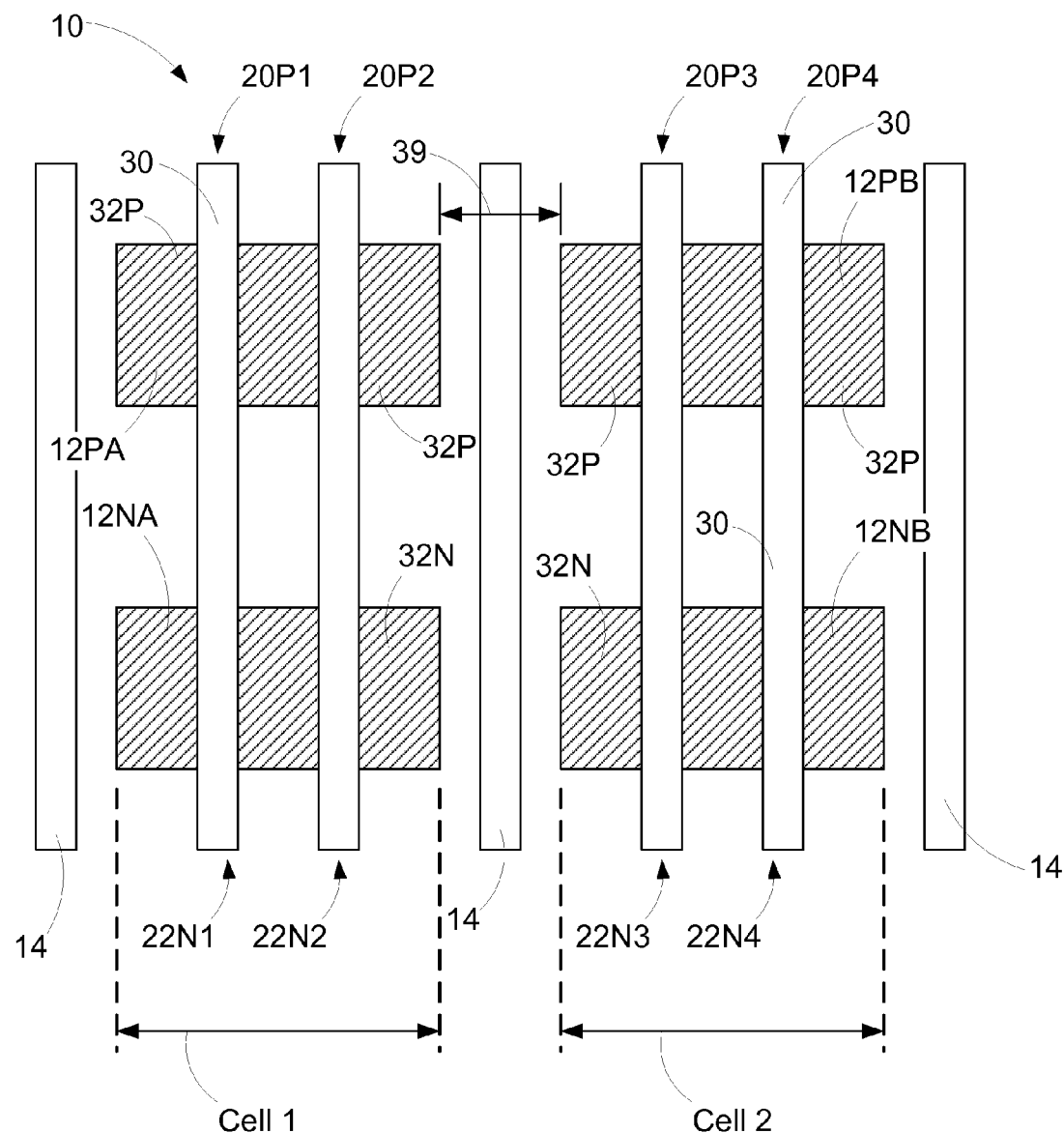
(Prior Art) Figure 1

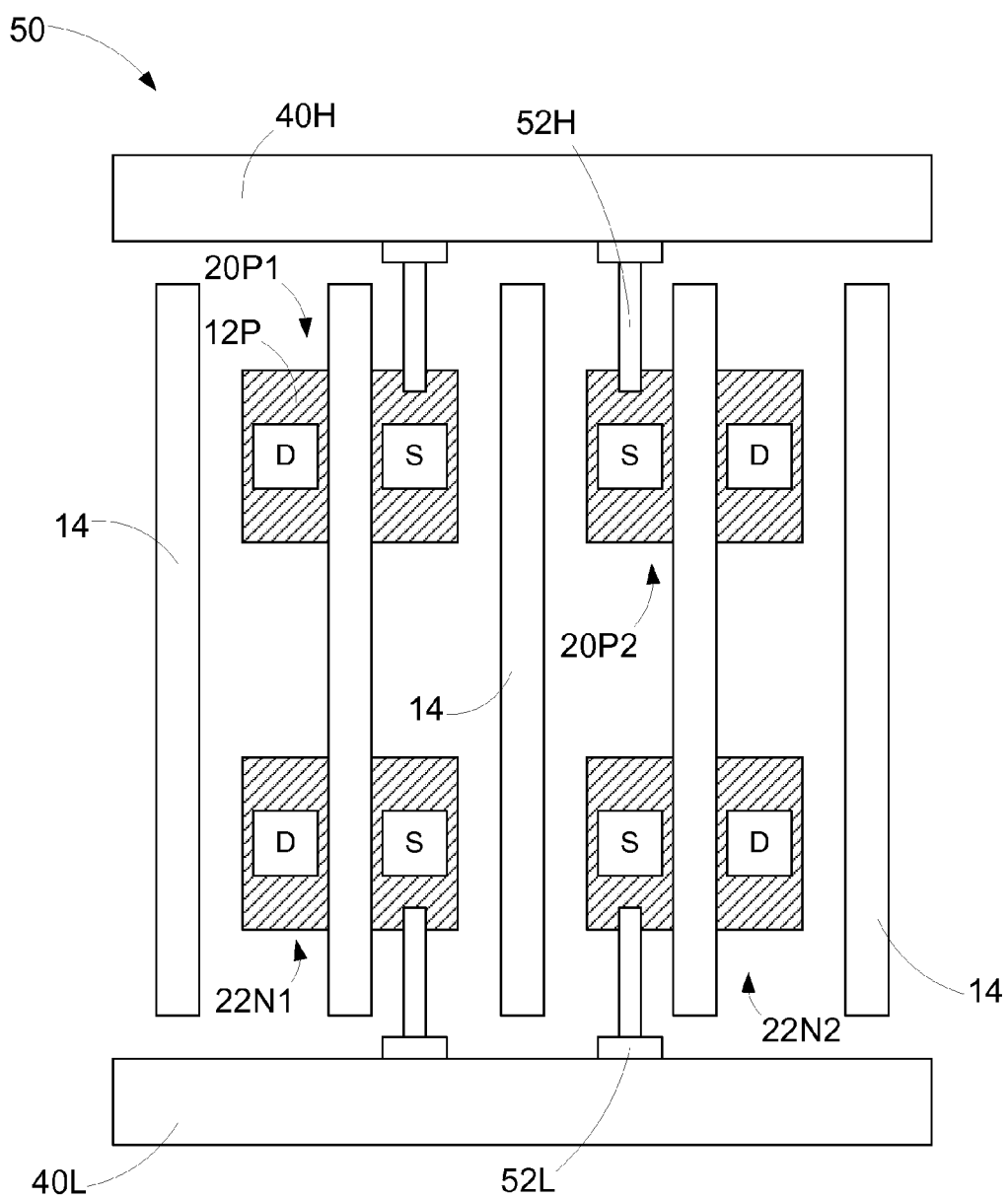
(Prior Art) Figure 2

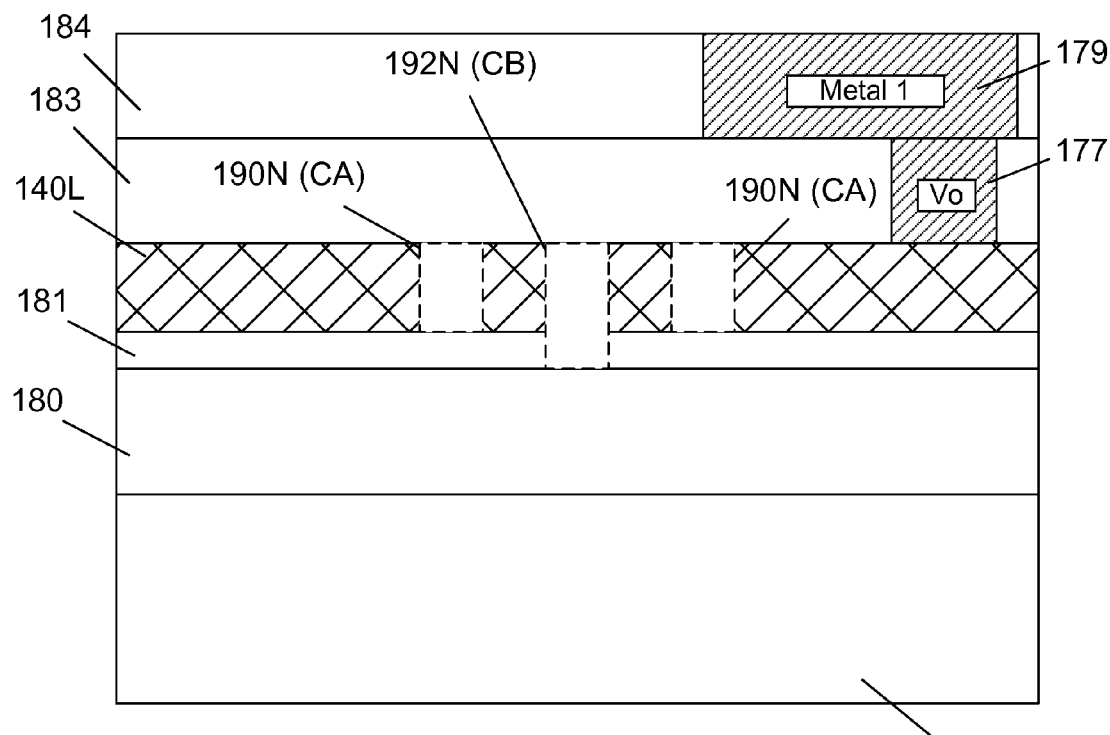
**Figure 5A-A
View "A-A"**

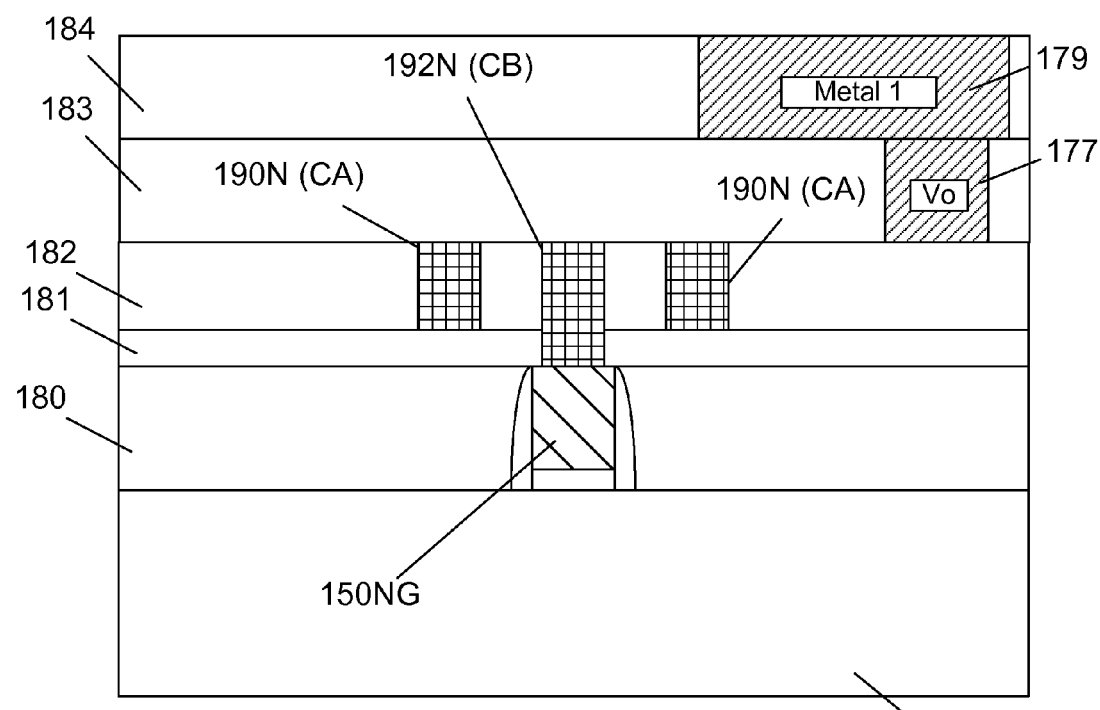
**Figure 5A-B
View "B-B"**

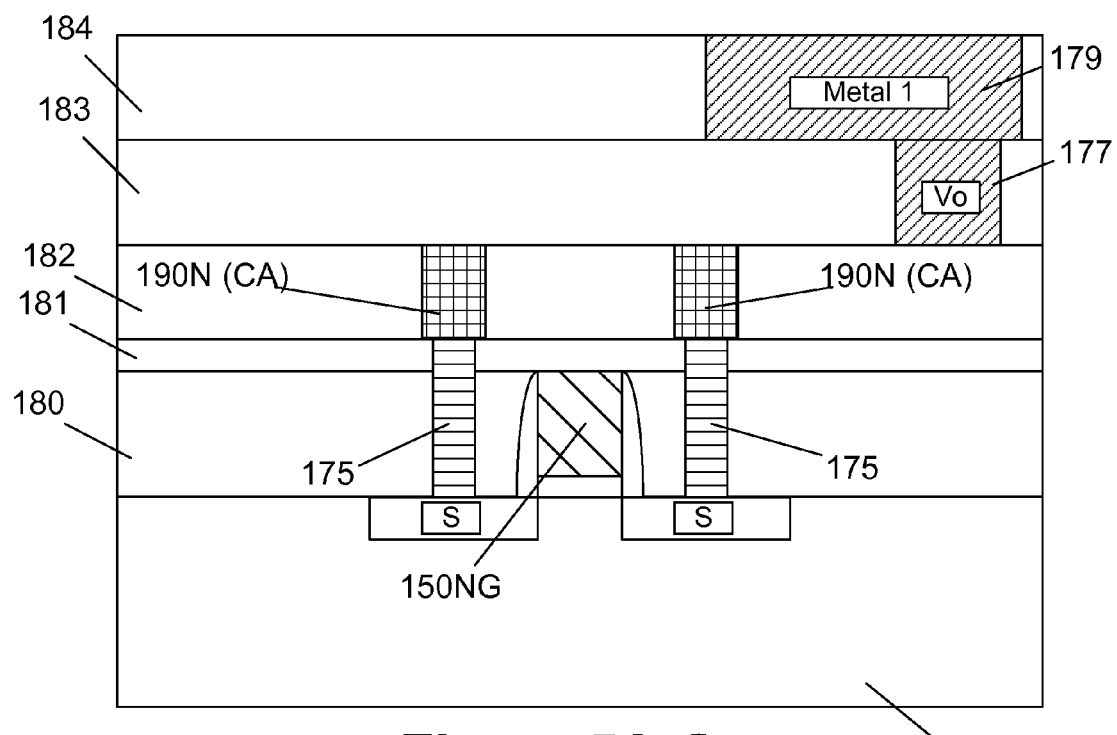
**Figure 5A-C
View "C-C"**

SEMICONDUCTOR DEVICES FORMED ON A CONTINUOUS ACTIVE REGION WITH AN ISOLATING CONDUCTIVE STRUCTURE POSITIONED BETWEEN SUCH SEMICONDUCTOR DEVICES, AND METHODS OF MAKING SAME

BACKGROUND OF THE INVENTION

1. Field of the Invention

Generally, the present disclosure relates to the manufacture of sophisticated semiconductor devices, and, more specifically, to a plurality of semiconductor devices formed in and above a continuous active region and a conductive isolating structure formed above the active region between the devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (FETs) represent one important type of circuit element that substantially determines performance of the integrated circuits. Field effect transistors are typically either NFET devices or PFET devices. During the fabrication of complex integrated circuits, millions of transistors, e.g., NFET transistors and/or PFET transistors, are formed on a substrate including a crystalline semiconductor layer. A field effect transistor, irrespective of whether an NFET transistor or a PFET transistor is considered, typically comprises so-called PN junctions that are formed by an interface of highly doped regions, referred to as drain and source regions, with a slightly doped or non-doped region, referred to as a channel region, disposed between the highly doped source/drain regions. The channel length of a transistor is generally considered to be the lateral distance between the source/drain regions.

As device dimensions have continued to shrink over recent years, it is becoming more challenging to accurately and repeatedly manufacture integrated circuit products that meet performance criteria established for such integrated circuit products. Typically, semiconductor devices are formed on discrete islands of semiconducting substrate, i.e., active regions that are defined in the substrate by isolation structures. For example, FIGS. 1 and 2 depict an illustrative prior art device 10 comprised of first and second cells ("Cell 1" and "Cell 2"). The cells are intended to be representative in nature. For example, in one illustrative example, Cell 1 may be a NAND circuit and Cell 2 may also be a NAND circuit. In another example, Cell 1 may be an inverter and Cell 2 may be a flip-flop.

With continuing reference to FIGS. 1 and 2, a plurality of spaced apart active regions 12PA, 12PB, 12NA and 12NB are defined in a semiconducting substrate by one or more isolation structures. A plurality of PFET devices 20P1-2 are formed in and above the active region 12PA and a plurality of PFET devices 20P3-4 are formed in and above the active region 12PB. The PFET devices comprise P-doped source/drain regions 32P, while the NFET devices 22N1-4 comprise N-doped source/drain regions 32N. In the depicted example, the various PFET and NFET devices share a common electrode structure 30 that extends across the separated active regions and the isolation region therebetween. For example, PFET transistor 20P1 and NFET transistor 22N1 share a common gate electrode structure 30 that extends across both of the active regions 12PA, 12NA and the isolation region between those two active regions. The structures 14 may be dummy gate structures that are provided in an attempt to improve dimensional accuracy when forming the gate structures 30 for the device 10.

FIG. 2 depicts another illustrative prior art device 50. The device comprises illustrative PFET devices 20P1 and 20P2 formed above spaced apart active regions. The device 50 also includes illustrative NFET transistors 22N1, 22N2 that are also formed above spaced apart active regions. FIG. 2 depicts an illustrative relatively high voltage power rail 40H that is conductively coupled to the illustrative source regions ("S") of the PFET devices 20P1, 20P2 via illustrative contacts 52H. Also depicted in FIG. 2 is an illustrative relatively low voltage power rail 40L that is conductively coupled to the source regions of the NFET devices 22N1, 22N2 via illustrative contacts 52L.

With each new technology generation, all dimensions of the integrated circuit product are typically reduced. For example, as device dimensions are reduced, the lateral spacing 39 (see FIG. 1) between adjacent active regions, e.g., the lateral spacing 39 between the active regions 12PA and 12PB, also decreases. In some cases, the lateral spacing 39 may be as little as about 40 nm. As this lateral spacing decreases, there is an increased risk of creating short circuits between the two adjacent cells. Of course, one way to rectify this problem would be to simply increase the spacing between adjacent active regions. However, such an approach would be very costly in terms of the plot space on the device that is lost and would run counter to the trend in integrated circuit products of reducing the size of such products. Other techniques have been tried to alleviate this problem, e.g., a so-called Rx-tuck process, but such processes also tend to consume excessive amounts of chip plot space and may result in considerable device performance degradation.

The present disclosure is directed to a plurality of semiconductor devices formed in and above a continuous active region and a conductive isolating structure formed above the active region between the devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a device that comprises a plurality of semiconductor devices formed in and above a continuous active region and a conductive isolating structure formed above the active region between the devices, and various methods of making such a device. One illustrative device disclosed herein includes a continuous active region defined in a semiconducting substrate, first and second transistors formed in and above the continuous active region, each of the first and second transistors comprising a plurality of doped regions formed in the continuous active region, a conductive isolating electrode positioned above the continuous active region between the first and second transistors and a power rail conductively coupled to the conductive isolating electrode.

Another illustrative device disclosed herein includes first and second continuous active regions defined in a semiconducting substrate, first and second PFET transistors formed in and above the first continuous active region, and first and second NFET transistors formed in and above the second continuous active region. This embodiment of the device further includes a first conductive isolating electrode positioned above the first continuous active region between the first and second PFET transistors, a first power rail conductively coupled to the first conductive isolating electrode, wherein the first power rail is adapted to be at a logically high voltage level, a second conductive isolating electrode positioned above the second continuous active region between the first and second NFET transistors and a second power rail conductively coupled to the second conductive isolating electrode, wherein the second power rail is adapted to be at a logically low voltage level.

BRIEF DESCRIPTION OF THE DRAWINGS

The disclosure may be understood by reference to the following description taken in conjunction with the accompanying drawings, in which like reference numerals identify like elements, and in which:

FIGS. 1 and 2 depict illustrative examples of various prior art semiconductor devices formed in a semiconducting substrate;

Figure 3A:
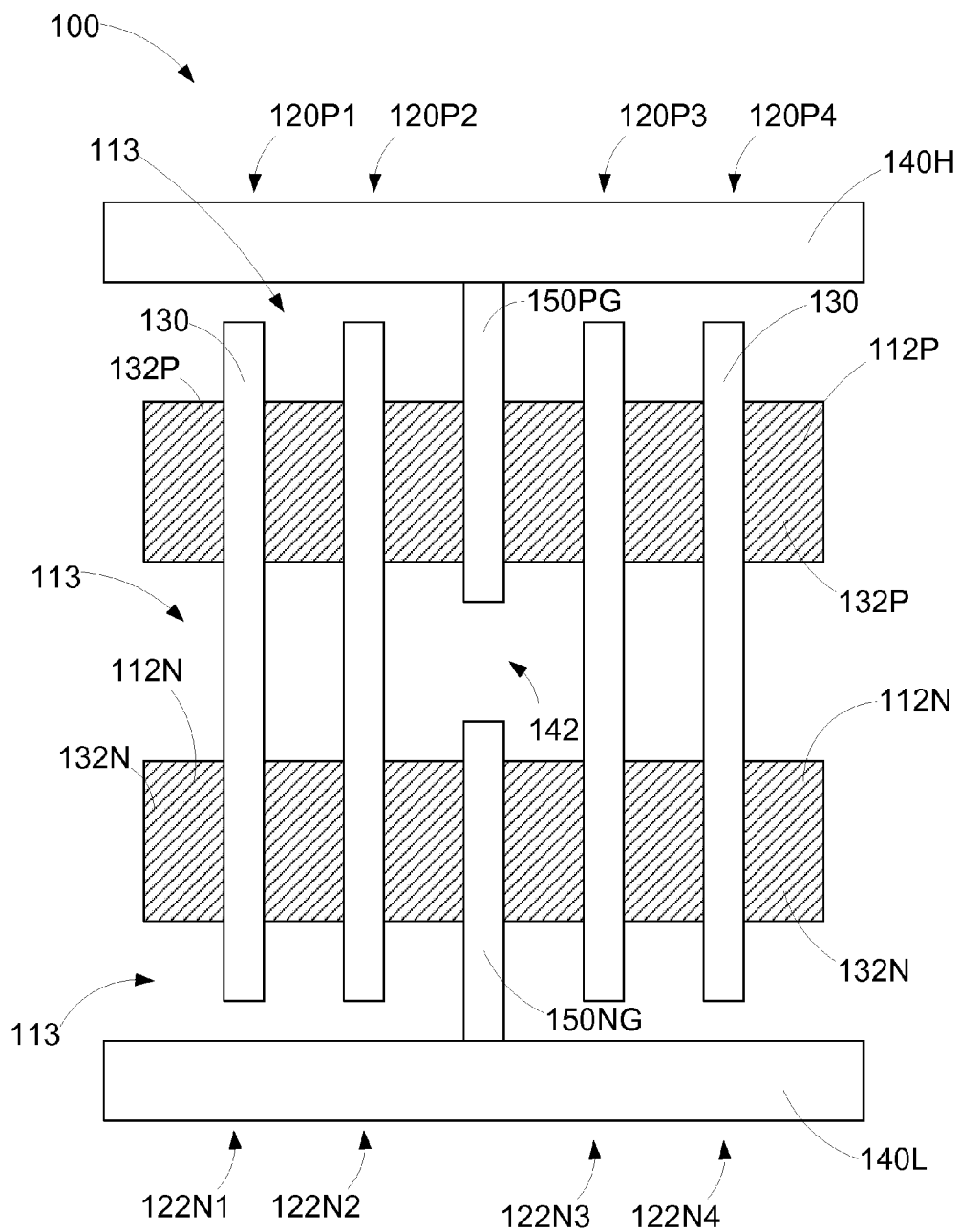
FIGS. 3A-3C are schematic depictions of illustrative embodiments of semiconductor devices formed on continuous active regions that employ illustrative examples of the isolating electrode structures disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to a device that comprises a plurality of semiconductor devices formed in and above a continuous active region and a conductive isolating structure formed above the active region between the devices, and various methods of making such a device. As will be readily apparent to those skilled in the art upon a complete reading of the present application, the presently disclosed subject matter may be used with a variety of different devices and technologies, e.g., NFET, PFET, CMOS, etc., and it may be readily employed on a variety of integrated circuit products, including, but not limited to, ASIC's, logic devices, memory devices, etc. With reference to the attached drawings, various illustrative embodiments of the devices and methods disclosed herein will now be described in more detail.

Figure 3B:
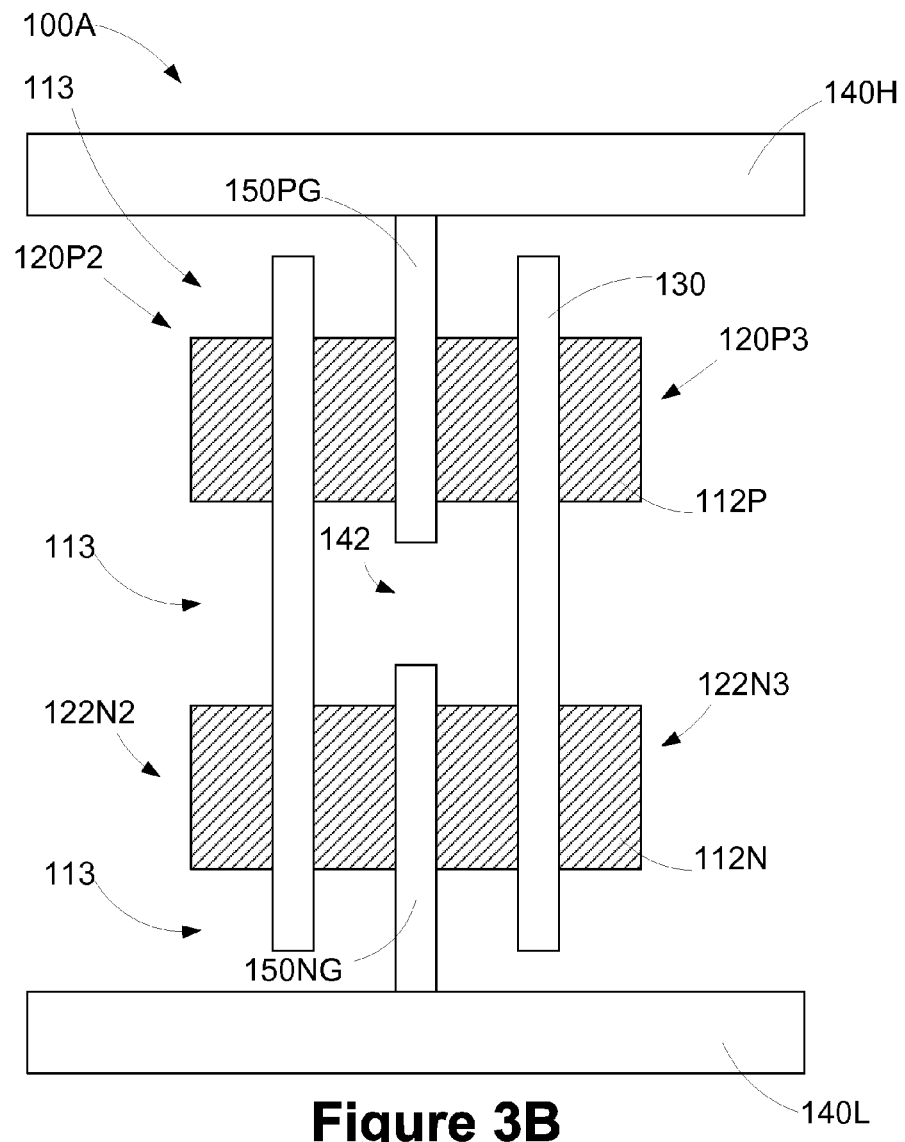
Figure 3C:
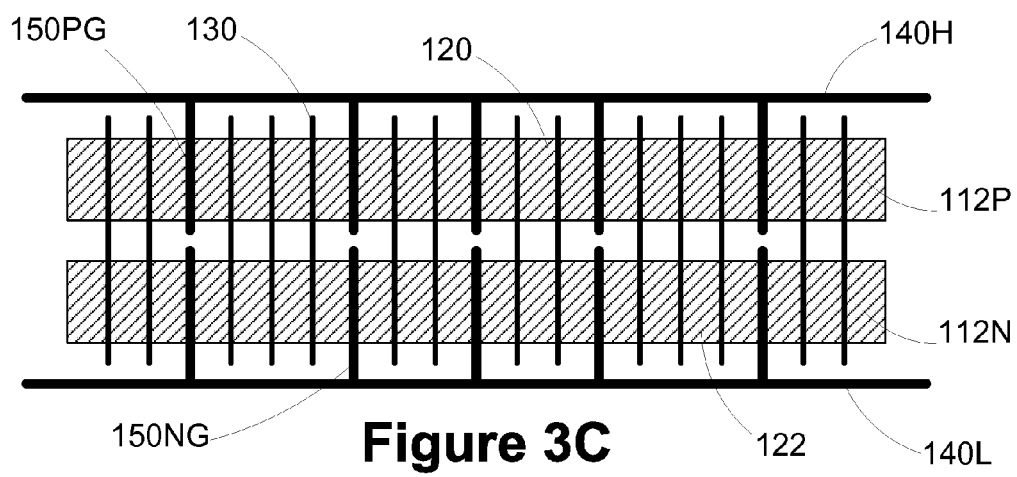

FIG. 3A-3C are various schematic drawings that explain certain aspects of the various devices disclose herein. As shown in FIG. 3A, an illustrative device 100 comprises a first continuous active region 112P and a second continuous active region 112N formed in a semiconducting substrate. The active regions 112P, 112N are defined in the semiconducting substrate by isolation structures 113 that may be formed using traditional techniques. The substrate may take the form of a silicon-on-insulator (SOI) substrate that is comprised of a bulk substrate, a buried insulation layer (a so-called BOX layer) and an active layer positioned above the box layer. In such an embodiment, the active regions 112P, 112N would be formed in the active layer. The substrate may also be in bulk form. The substrate may also be made of materials other than silicon. Thus, the terms substrate or semiconducting substrate as used herein and in the appended claims should not be considered as limited to any particular configuration or material.

With continuing reference to FIG. 3A, a plurality of PFET devices 120P1-4 are formed in and above the active region 112P and a plurality of NFET devices 122N1-4 are formed in and above the active region 112N. The PFET devices 120 and the NFET devices 122 may be formed using traditional materials and techniques. For example, the PFET devices 120 may be comprised of various P-doped regions 132P, e.g., P-doped source/drain regions, and the NFET devices 122 may be comprised of various N-doped regions 132N. In the depicted example, the device 100 is a CMOS device that comprises a plurality of common gate structures 130 that are shared by the various PFET devices 120 and NFET devices 122. The common gate structures 130 are positioned above both of the active regions 112P, 112N and they each span the isolation material positioned between the active regions 112P, 112N. In other applications, the device 100 may not have this illustrative common gate structure configuration. As will be appreciated by one skilled in the art after a complete reading of the present application, the gate structures 130 may be formed using a variety of different materials and by performing a variety of known techniques. For example, the gate insulation layer in such a gate structure 130 may be comprised of a variety of different insulating materials, e.g., silicon dioxide, a so-called high-k insulating material (k value greater than 10). The gate electrode in such a gate structure 130 may be comprised of polysilicon or it may contain at least one metal layer. The gate structures 130 of the transistor 100 may be made using so-called "gate first" or "gate last" techniques. Thus, the presently disclosed inventions should not be considered as limited to any particular materials of construction for the gate structures 130 nor the manner in which such a gate structure 130 is formed.

Still with continuing reference to FIG. 3A, the device 100 further comprises an isolating electrode 150PG that is conductively coupled to a schematically depicted power rail 140H at a logically high voltage, e.g., $V_{dd}$. The device also includes an isolating electrode 150NG that is conductively coupled to a power rail 140L that is at a logically low voltage, e.g., ground. Of course, the absolute magnitude of the voltages on the power rails 140H, 140L may vary depending upon the particular application, but the voltage on the power rail 140H will be relatively higher than the voltage on the power rail 140L. In the illustrative example shown in FIG. 3A, the isolating electrodes 150PG, 150NG are separated by a distance 142. In the depicted embodiment, the isolating electrode 150PG spans across the entirety of the active region 112P, while the isolating electrode 150NG spans across the entirety of the active region 112N. In one illustrative embodiment, the isolating electrodes 150PG and 150NG have the same structure and configuration as the gate structures 130, and they may be initially formed at the same time the gate structures 130 are formed. In other cases, the isolating electrodes 150PG and 150NG may be comprised of different materials, may be a different physical size and/or may be formed at different times as compared to the gate structures 130. In one illustrative embodiment, the isolating electrodes 150PG and 150NG and the gate structures 130 are all initially formed as elongated continuous line-type structures. Thereafter, the isolating electrodes 150PG and 150NG are defined by performing another etching process. The isolating electrodes 150PG and 150NG may be conductively coupled to the power rails 140H, 140L, respectively, by any of a variety of different conductive structures that are formed in a layer of insulating material positioned above the substrate. The isolating electrodes 150PG and 150NG each have a long axis and, in one embodiment, the long axis of the isolating electrode 150PG is substantially aligned with the long axis of the isolating electrode 150NG.

FIG. 3B depicts one illustrative embodiment of an illustrative unit cell 100A of the device 100. In this example, the unit cell 100A comprises PFET transistors 120P2 and 120P3 that are positioned on opposite sides of the isolating electrode 150PG and NFET transistors 122N2 and 122N3 that are positioned on opposite sides of the isolating electrode 150NG. Stated another way, the isolating electrode 150PG is positioned above a space between the adjacent doped regions of the transistors 120P2 and 120P3, while the isolating electrode 150NG is positioned above a space between the adjacent doped regions of the transistors 122N2 and 122N3. Of course, as will be appreciated by one skilled in the art after a complete reading of the present application, the inventions disclosed herein are not limited in terms of how many transistors may be formed in the active regions 112P, 112N, the number of isolating electrodes 150PG and 150NG formed on the device 100, nor the number of transistors that may be associated with each of the isolating electrodes 150PG and 150NG. Moreover, the number of transistors associated with each of the isolating electrodes 150PG and 150NG need not be the same for either of the active regions 112P or 112N, and it need not be uniform within either of the active regions 112P, 112N. For example, the devices 100 disclosed herein may be employed in situations wherein there are hundreds if not thousands of transistors formed in each of the active regions 112P, 112N and hundreds of isolating electrodes 150PG and 150NG. FIG. 3C is a simplistic line-based drawing indicating one example of a device 100 comprised of fourteen PFET devices 120, five isolating electrodes 150PG that are coupled to the power rail 140H, fourteen NFET devices 122 and five isolating electrodes 150NG that are coupled to the power rail 140L. Thus, the presently disclosed inventions should not be considered as limited to any particular number or arrangement of transistor devices or any particular number or arrangement of the isolating electrodes 150PG, 150NG.

Figure 4A:
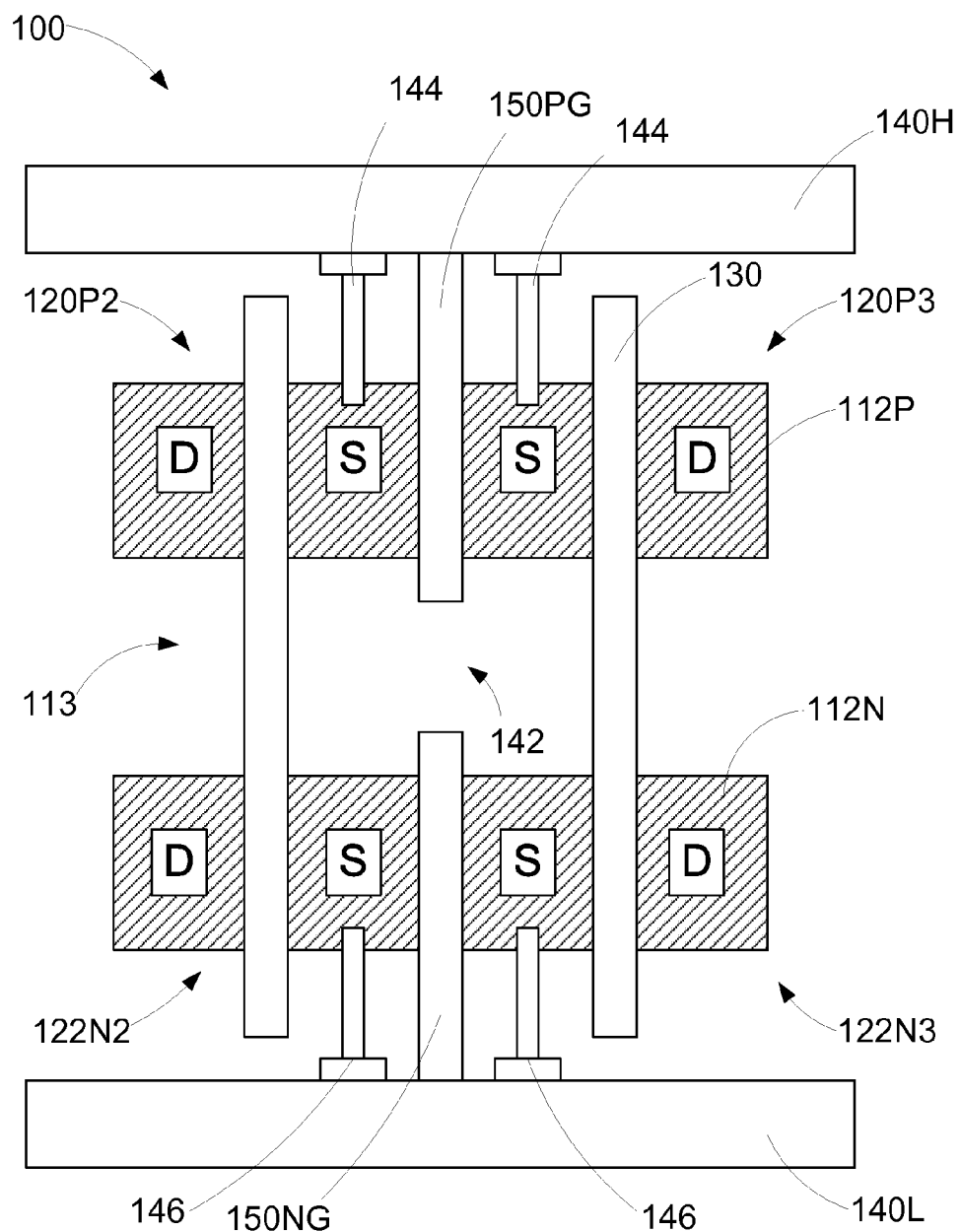
FIGS. 4A-4C are schematic depictions of illustrative examples of various possible configurations of illustrative semiconductor devices disclosed herein.
Figure 4B:
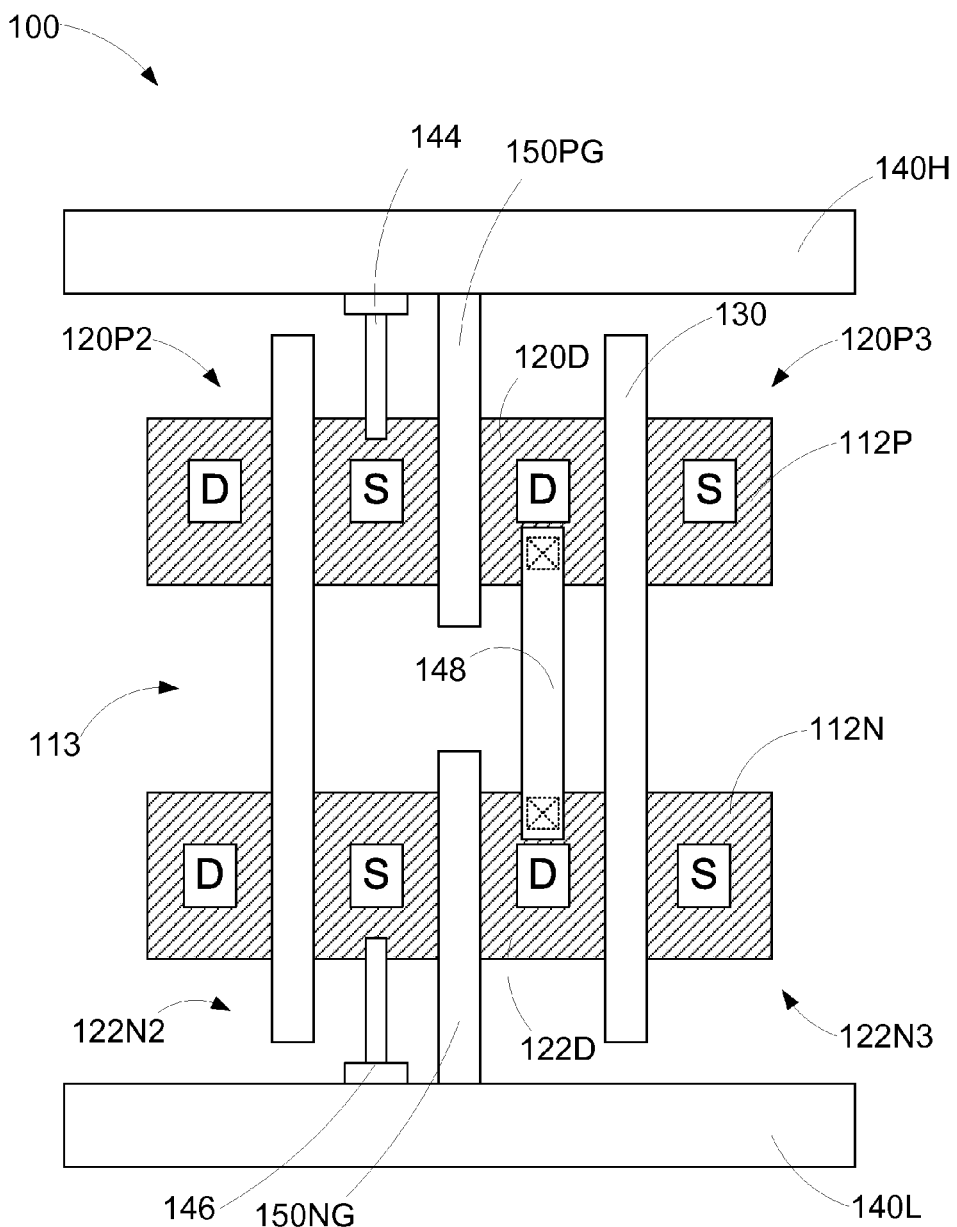
Figure 4C:
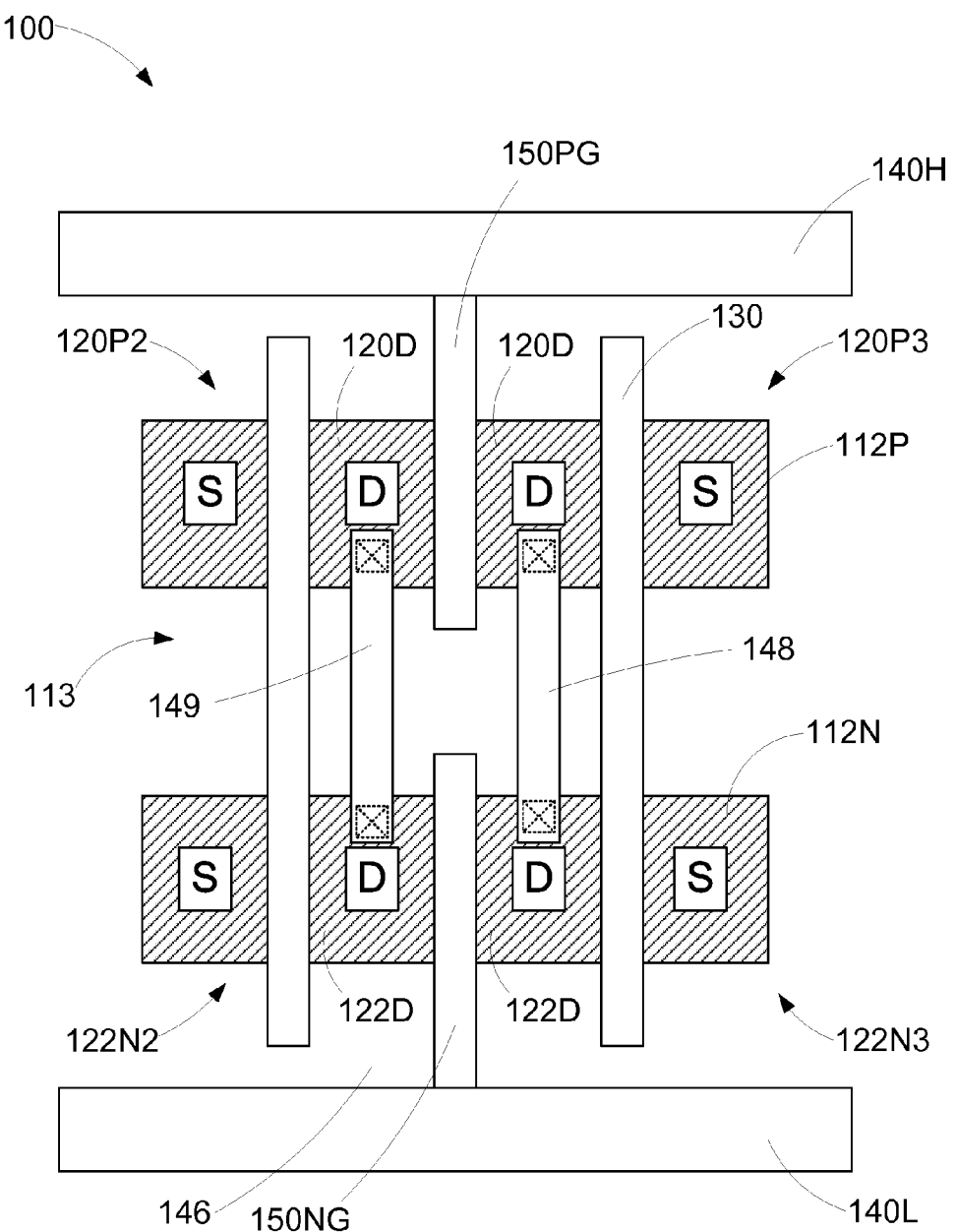

FIG. 4A-4C depict various illustrative examples that schematically depict how the device 100 may be configured in various situations. FIG. 4A depicts the illustrative example wherein the isolating electrodes 150PG, 150NG are positioned between source regions ("S") of the respective transistors. The drain regions ("D") of the various transistors are also depicted in FIG. 4A. More specifically, in FIG. 4A, the isolating electrode 150PG is positioned between the source regions of the PFET devices 120P2 and 120P3, while the isolating electrode 150NG is positioned between the source regions of the NFET devices 122N2 and 122N3. In this illustrative example, the source regions of the PFET devices 120P2-3 are coupled to the power rail 140H by schematically depicted conductive structures 144, while the source regions of the NFET devices 122N2-3 are coupled to the power rail 140L by schematically depicted conductive structures 146.

FIG. 4B depicts the illustrative example wherein the isolating electrodes 150PG, 150NG are positioned between a source region ("S") on one adjacent transistor and a drain region ("D") on the other adjacent transistor. More specifically, in FIG. 4B, the isolating electrode 150PG is positioned between the source region of the PFET device 120P2 and the drain region of the PFET device 120P3, while the isolating electrode 150NG is positioned between the source region of the NFET device 122N2 and the drain region of the NFET device 122N3. In this illustrative example, the source region of the PFET device 120P2 is conductively coupled to the power rail 140H by schematically depicted conductive structures 144, while the source region of the NFET device 122N2 is coupled to the power rail 140L by schematically depicted conductive structures 146. The drain region of the PFET device 120P3 and the drain region of the NFET device 122N3 are conductively coupled to one another via a conductive strap 148 and illustrative contacts.

FIG. 4C depicts the illustrative example wherein the isolating electrodes 150PG, 150NG are positioned between drain regions ("D") of the respective transistors. More specifically, in FIG. 4C, the isolating electrode 150PG is positioned between the drain regions of the PFET devices 120P2 and 120P3, while the isolating electrode 150NG is positioned between the drain regions of the NFET devices 122N2 and 122N3. In this illustrative example, only the isolating electrodes 150PG, 150NG are coupled to the power rails 140H, 140L, respectively. In this example, the drain region of the PFET device 120P3 and the drain region of the NFET device 122N3 are conductively coupled to one another via a conductive strap 148 and illustrative contacts, while the drain region of the PFET device 120P2 and the drain region of the NFET device 122N2 are conductively coupled to one another via a conductive strap 149 and illustrative contacts. The various conductive structures 144, 146, 148, 149 and the depicted contacts may be of any desired configuration or material, they may be formed in one or more layers of insulating materials positioned above the substrate, and they may be formed using a variety of different techniques.

Figure 5A:
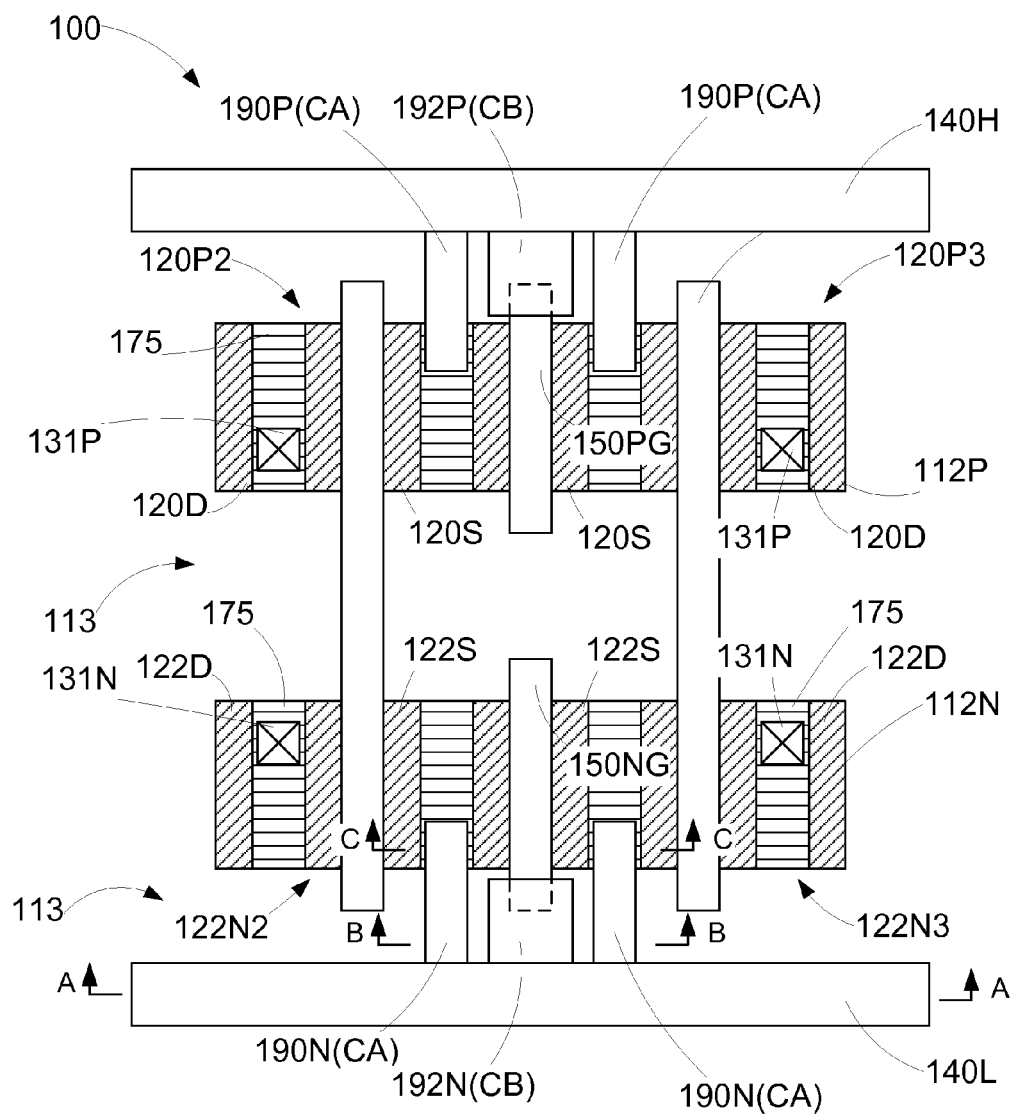
FIGS. 5A-5E are plan and cross-sectional views depicting various possible configurations of illustrative semiconductor devices disclosed herein.

With reference to FIGS. 5A-5E, further illustrative embodiments of various inventions disclosed herein will be further described. FIG. 5A is a schematic plan view of one illustrative embodiment of the device 100 wherein the isolating electrode 150PG is positioned between the source regions 120S of the PFET devices 120P2 and 120P3, while the isolating electrode 150NG is positioned between the source regions 122S of the NFET devices 122N2 and 122N3, a configuration that also corresponds to FIG. 4A. The drain regions for the PFET devices are denoted with the reference number 120D while the drain regions for the NFET devices are denoted with the reference number 122D. At the point of fabrication depicted in FIG. 5A, conductive line-type device level contacts 175 are formed on each of the source/drain regions for the various transistor devices. In some cases, these illustrative device level contacts 175 may be referred to within the industry as so-called trench silicide regions.

Figure 5B:
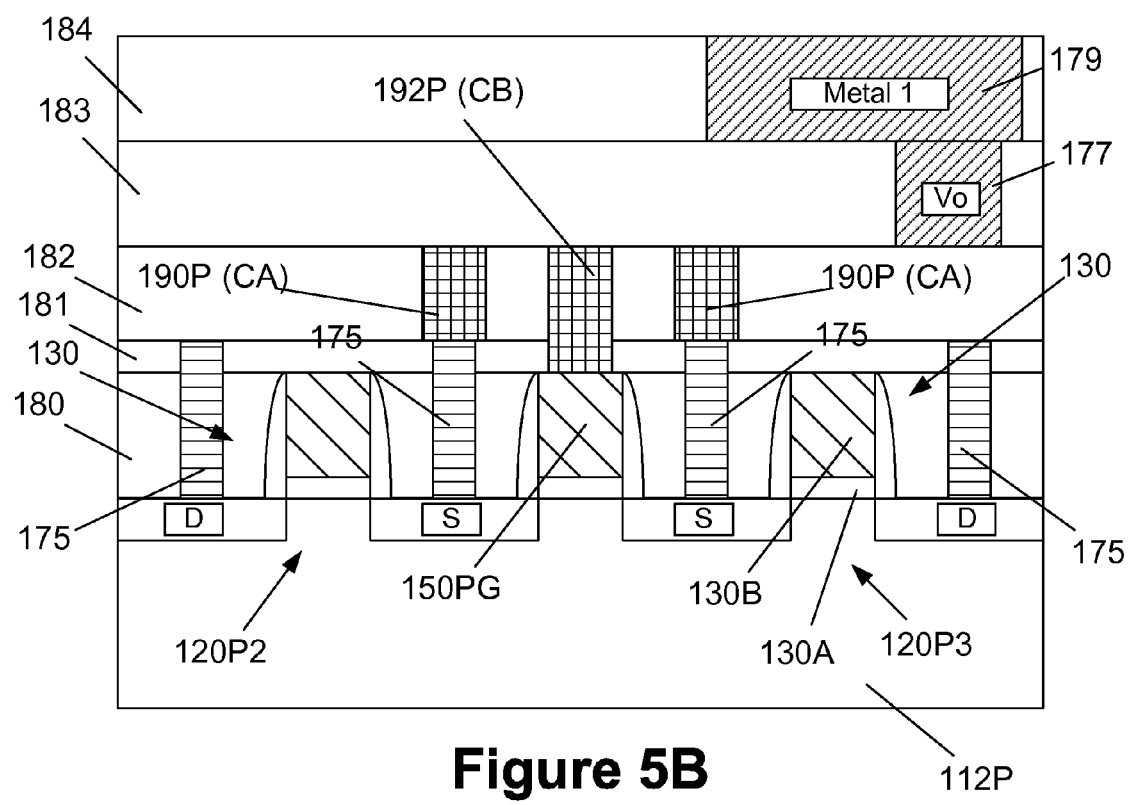
Figure 5C:
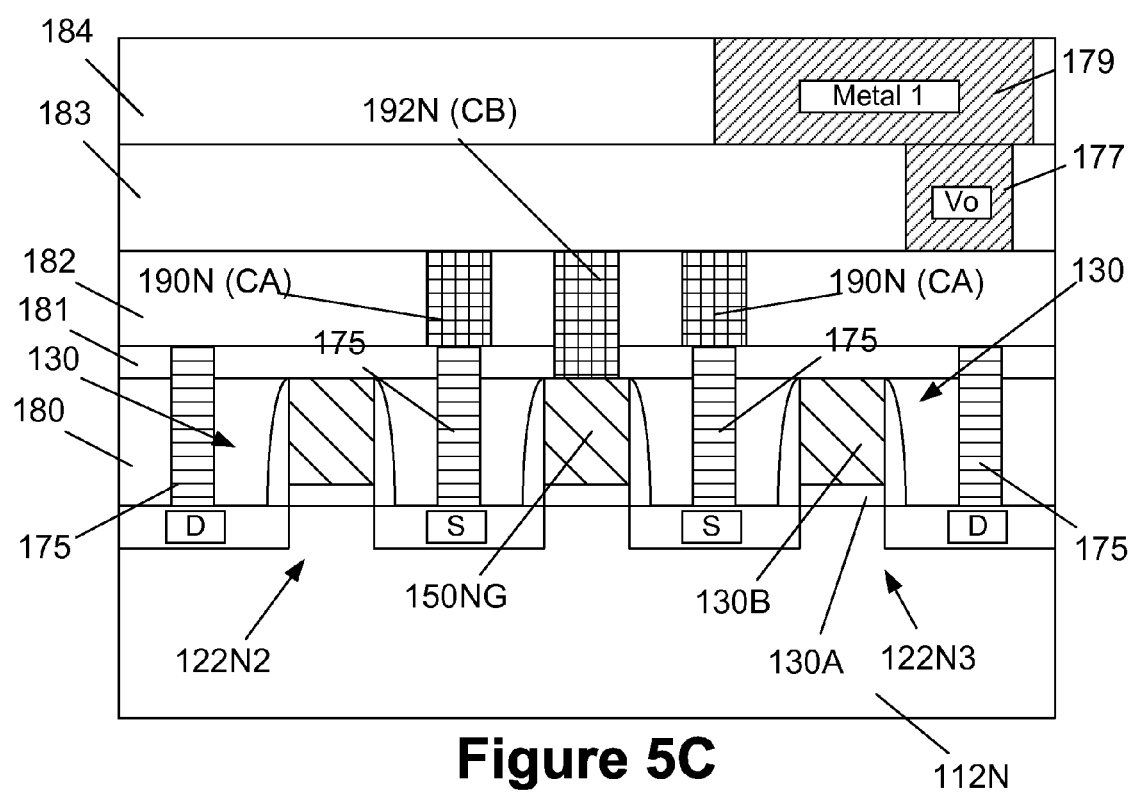

With continuing reference to FIGS. 5A-5C, in one illustrative embodiment, the device level contacts 175 that contact the source regions 120S of the transistors 120P2 and 120P3 are conductively coupled to the power rail 140H by a plurality of conductive contacts 190P and the isolating electrode 150PG is conductively coupled to the power rail 140H by a conductive contact 192P. The device level contacts 175 that contact the source regions 122S of the transistors 122N2 and 122N3 are conductively coupled to the power rail 140L by a plurality of conductive contacts 190N, and the isolating electrode 150NG is conductively coupled to the power rail 140L by a conductive contact 192N. The device level contacts 175 that are coupled to the drain regions 120D of the PFET devices are conductively contacted by contacts 131P. The contacts 131P are conductively coupled to a conductive structure (not shown), such as a metal line, that is formed in a metallization layer, e.g., the metal 1 layer, formed above the substrate. The device level contacts 175 that are coupled to the drain regions 122D of the NFET devices are conductively contacted by contacts 131N. The contacts 131N are conductively coupled to a conductive structure (not shown), such as a metal line, that is formed in a metallization layer, e.g., the metal 1 layer, formed above the substrate.

In one illustrative embodiment disclosed herein, the power rails 140H, 140L and the previously described contacts 190P, 192P, 190N and 192N may all be formed in the so-called local interconnect level of the device 100. That is, the power rails 140H, 140L and the previously described contacts 190P, 192P, 190N and 192N may be formed in a level that is between the device level contacts 175 and the so-called "metal 1" layer that is typically the first general wiring layer formed above the substrate. Further explanation of this unique configuration will be explained in connection with the cross-sectional views "A-A", "B-B" and "C-C" taken where indicated in FIG. 5A. As shown therein, various layers of insulating material 180, 181, 182, 183 and 184 are formed above the substrate. The various layers of insulating material may be comprised of a variety of different material, e.g., silicon dioxide, silicon nitride, a low-k material (k value less than 3.5), and they may be arranged in any desired order. In one illustrative embodiment, the insulating layer 181 may serve as an etch stop layer and it may be comprised of a material that may be selectively etched with respect to the insulating layers 180, 182. In one illustrative example, the insulating layers 180, 182 may be comprised of silicon dioxide and the insulating layer 181 may be comprised of silicon nitride. The thickness of the various layers of insulating material may vary depending upon the particular application and they may be formed by performing a variety of known techniques, e.g., chemical vapor deposition (CVD), atomic layer deposition (ALD), or plasma enhanced versions of those processes. The various conductive structures, such as the power rails 140H, 140L and the previously described contacts 190P, 192P, 190N and 192N, may be comprised of a variety of different materials, e.g., copper, aluminum, tungsten, etc., and they may be formed by performing a variety of known techniques, e.g., damascene techniques.

The cross-sectional views "A-A", "B-B" and "C-C" are taken through the active region 112N (where the NMOS devices 122 are formed) and the power rail 140L. However, the arrangement of the contacts and the power rail depicted in these various views applies equally to the contacts and arrangement for the PMOS devices 120 and the power rail 140H. The cross-sectional view "A-A" is taken through the power rail 140L as indicated. The power rail 140L and the contacts 190N, 192N are formed in the same layer of insulating material 182 (not shown in view "A-A"). The contacts 190N, 192N are depicted with dashed lines as they are positioned behind the power rail 140L in this view. As can be seen, the power rail 140L is positioned above the isolation region 113. Also depicted in the view "A-A" is the so-called metal 1 layer 179 with a connecting via 177 to the power rail 140L. The cross-sectional view "B-B" is taken through the contacts 190N, 192N above the isolation region 113. As can be seen in the view "B-B", the contact 192N contacts the isolating electrode 150NG. The insulating layer 182 is depicted in this view. The cross-sectional view "C-C" is taken through the contacts 190N above the active region 112N. As can be seen in the view "C-C", the contacts 190N contact the device level contacts 175. By positioning the power rails 140H, 140L and the various contacts 190P, 192P, 190N and 192N in the so-called local interconnect level of the device 100, various advantages may be realized. Due to this local interconnect arrangement approach, the transistor width can be larger, for example, up to 15-20% larger as compared to prior art arrangements involving connections to the metal 1 layer. This increase in transistor width may result in increased circuit performance, e.g., about a 10-15% increase as compared to prior art devices. The increase in performance is due to the fact that a traditional connection scheme at a level above the local interconnect level requires the width of the transistors to be reduced in order to make room for the connections.

Figure 5D:
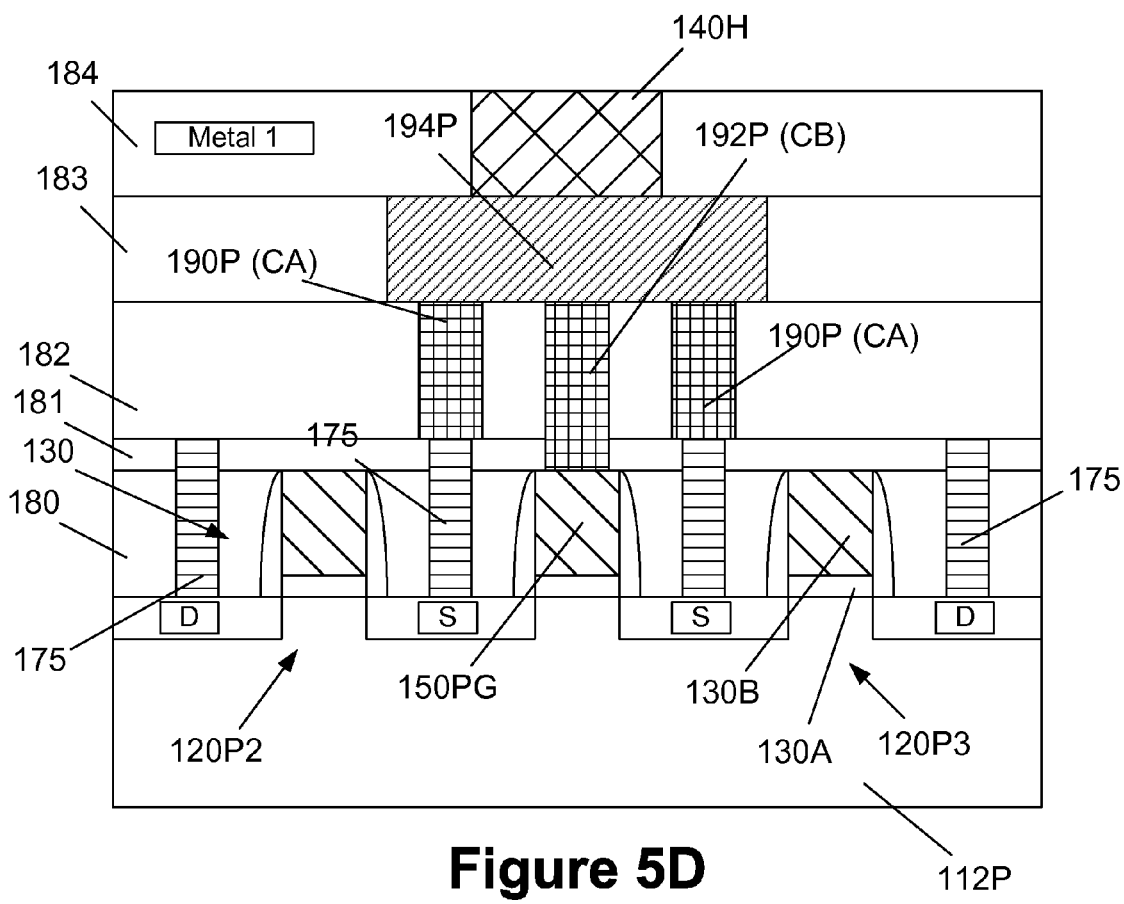
Figure 5E:
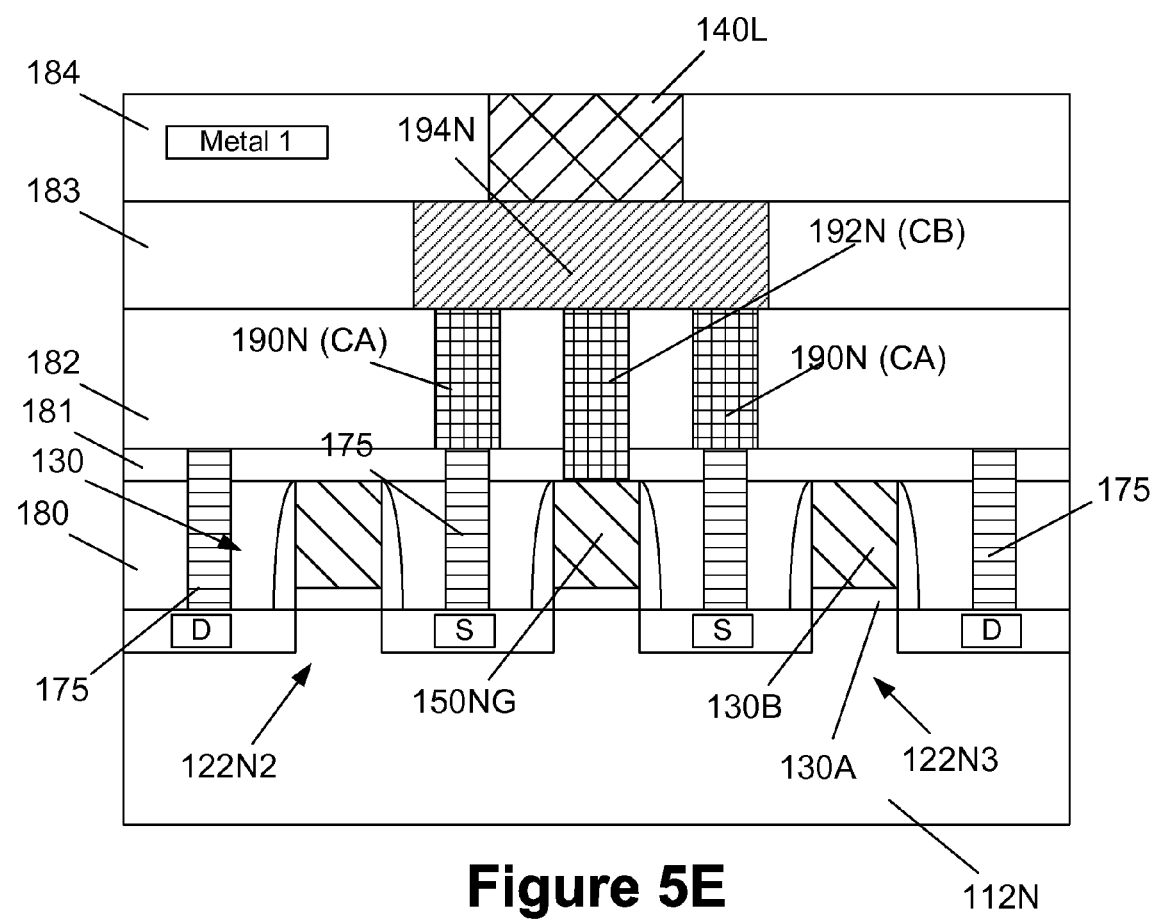

FIG. 5B-5C are cross-sectional views of one illustrative embodiment of various devices disclosed herein. More specifically, FIG. 5B is a cross-sectional view of the various PFET devices that are formed above the P-active region 112P, while FIG. 5C is a cross-sectional view of the various NFET devices that are formed above the N-active region 112N. As shown therein, the previously mentioned layers of insulating material 180, 181, 182, 183 and 184 are formed above the substrate. In one illustrative example, the insulating layers 180, 182 may be comprised of silicon dioxide and the insulating layer 181 may be comprised of silicon nitride. Conductive structures corresponding to "via 0" 177 and a metal line 179 in the "metal-1" layer are formed in layers of insulating material 183, 184, respectively. In the illustrative example depicted in FIGS. 5B-5E, the gate structures 130 are comprised of an illustrative gate insulation layer 130A and an illustrative gate electrode 130B. As noted earlier, the materials of construction of the gate structures 130 and the manner in which they are made may vary depending upon the particular application. In the examples depicted in FIGS. 5B-5D, the isolating gate electrodes 150PG, 150NG are part of a corresponding structure that is formed at the same time the illustrative gate structures 130 are formed, although that is not required in all instances. FIGS. 5B-5C depict the device 100 wherein the power rails 140H, 140L and the contacts 190P, 192P, 190N and 192N are all formed in the local interconnect level, i.e., in the insulating layer 182. In the embodiment shown in FIGS. 5D-5E, the power rails 140H, 140L are formed in the so-called metal 1 layer in the layer of insulating material 184. As shown in FIG. 5D, a conductive structure 194P conductively couples the contacts 190P, 192P to the power rail 140H. As shown in FIG. 5E, a conductive structure 194N conductively couples the contacts 190N, 192N to the power rail 140L.

Figure 6A:
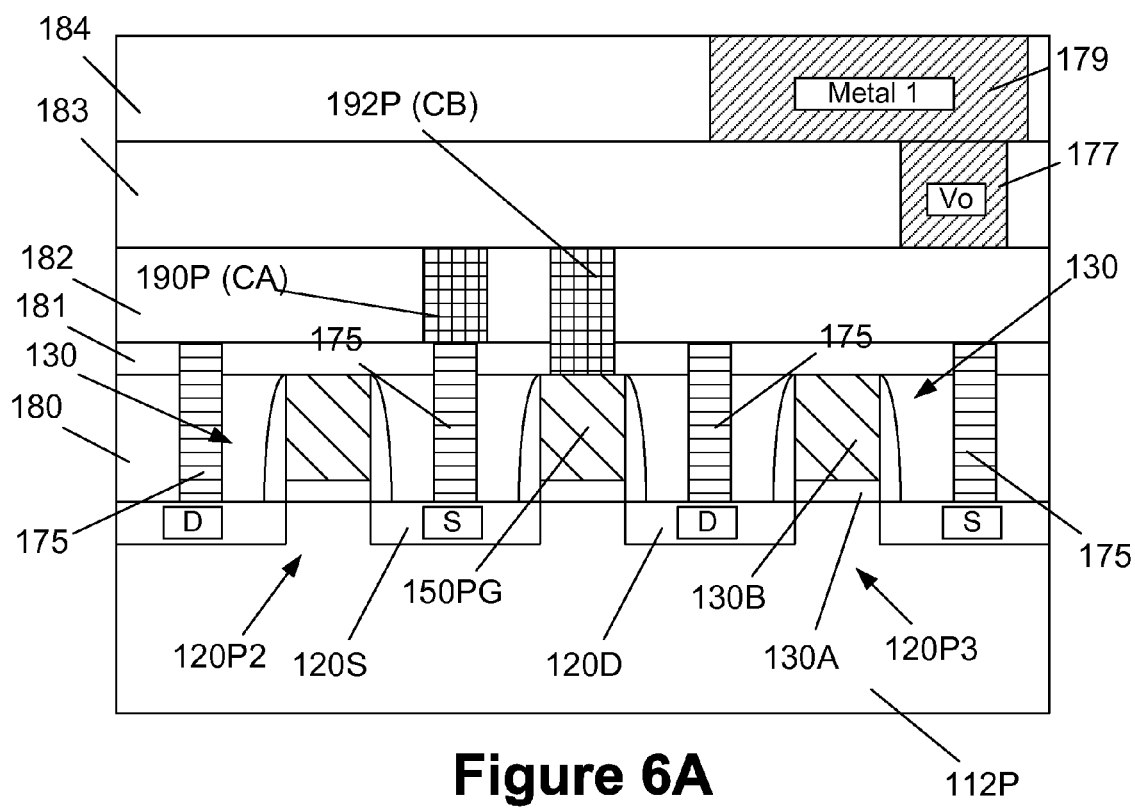
FIGS. 6A-6D are various cross-sectional views depicting another possible configuration of illustrative semiconductor devices disclosed herein.
Figure 6B:
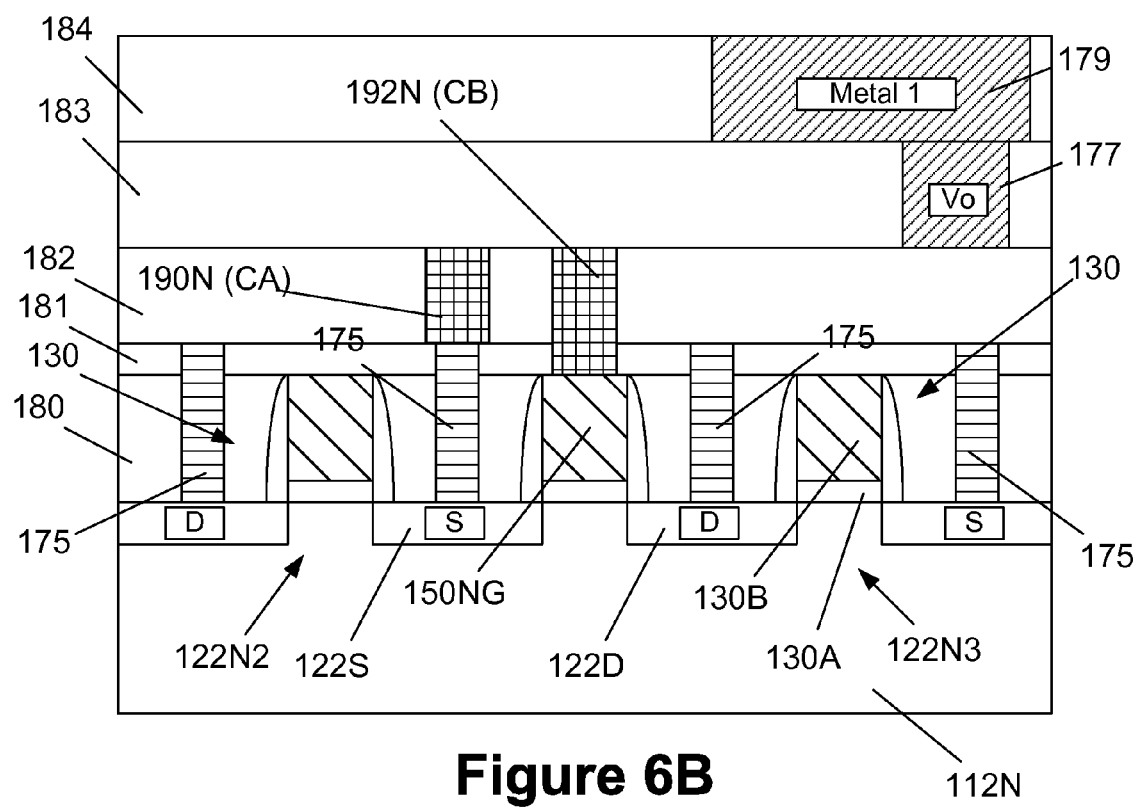
Figure 6C:
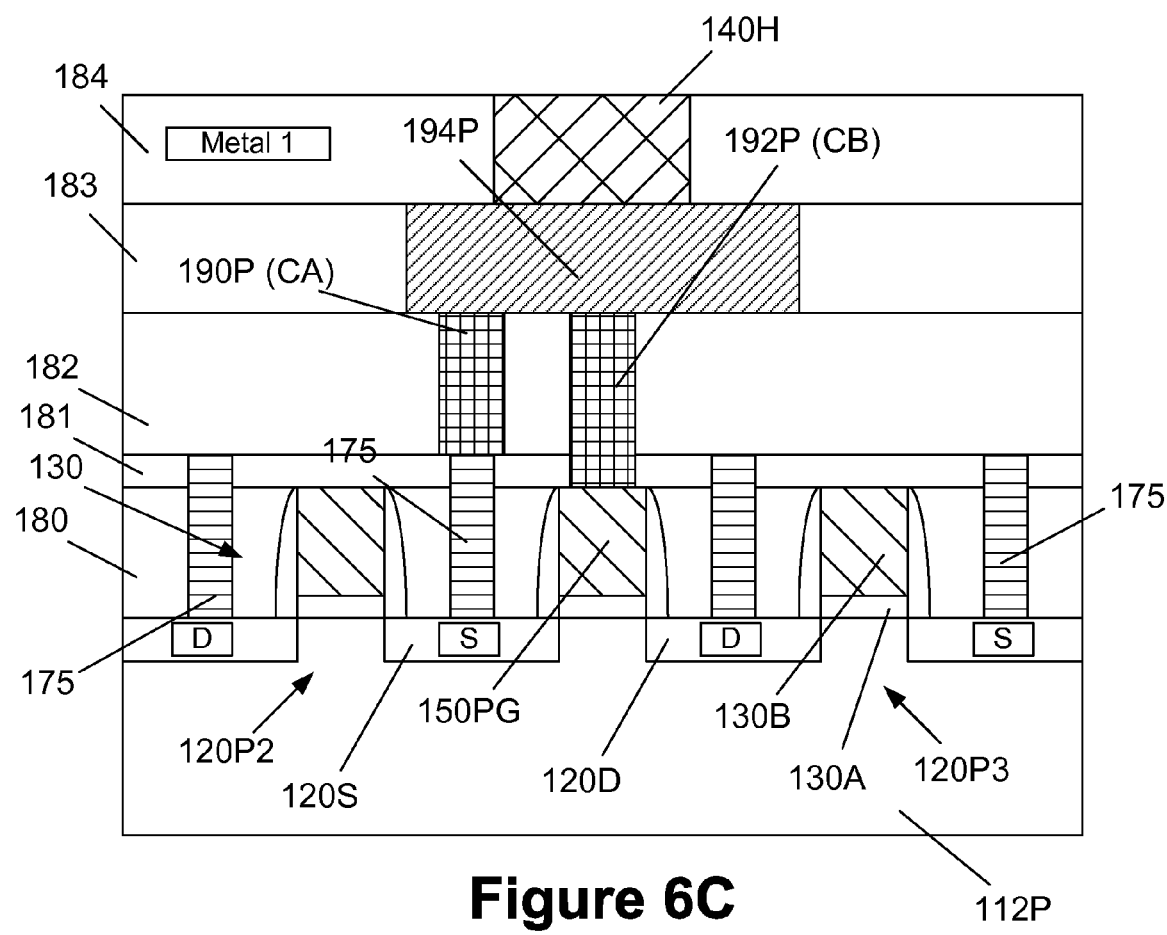
Figure 6D:
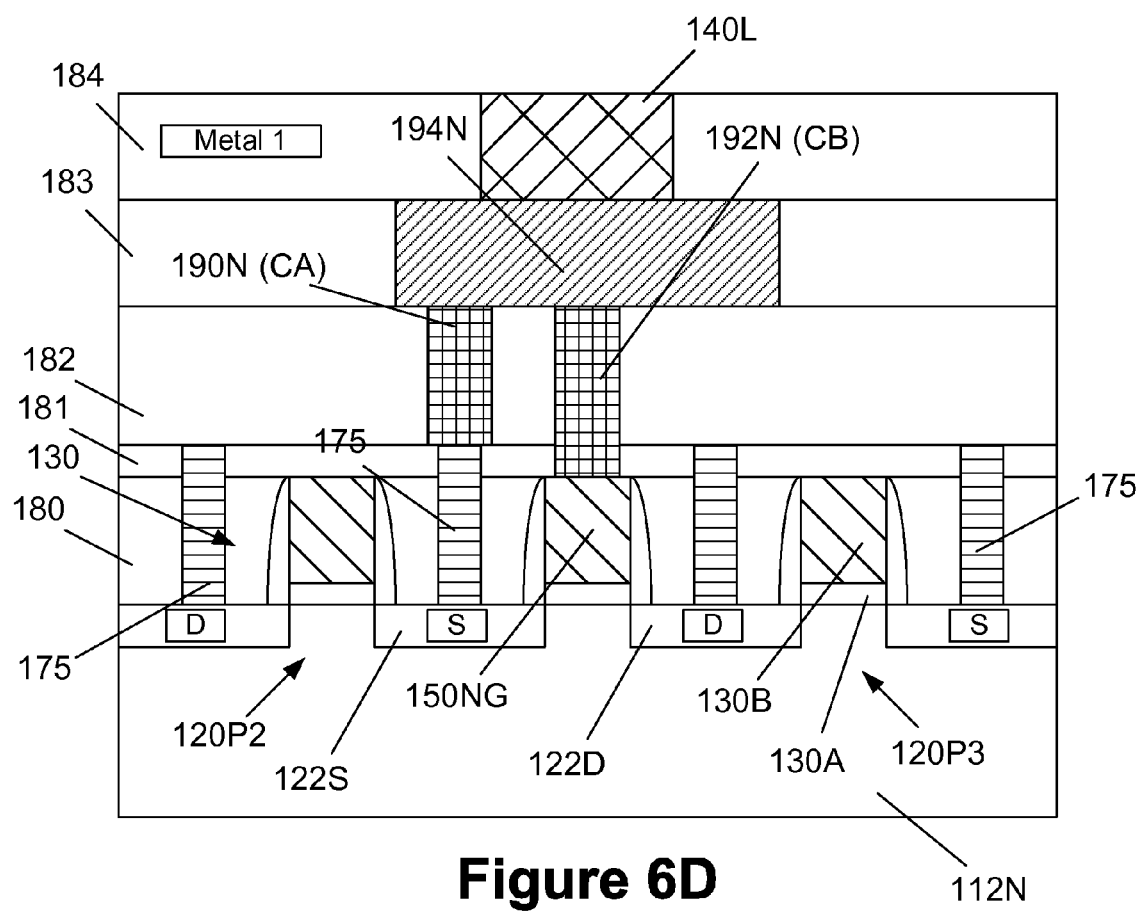

FIGS. 6A-6D depict further illustrative embodiments of various inventions disclosed herein. More specifically, FIGS. 6A and 6C depict the situation where the isolating electrode 150PG is positioned between the source region 120S of the PFET device 120P2 and the drain region 120D of the PFET device 120P3, a configuration that corresponds to FIG. 4B. FIGS. 6B and 6D depict the situation where the isolating electrode 150NG is positioned between the source region 122S of the NFET device 122N2 and the drain region 122D of the NFET device 122N3, a configuration that also corresponds to FIG. 4B. Note that, in FIGS. 6A-6D, the drain region 120D of the PFET transistor 120P3 is not connected to the power rail 140H, and the drain region 122D of the NFET transistor 122N3 is not connected to the power rail 140L. Rather, as shown in FIG. 4B, the drain region 120D of the PFET transistor 120P3 and the drain region 122D of the NFET transistor 122N3 are coupled to one another by a conductive structure 148 (not shown in FIGS. 6A-6D). FIGS. 6A-6B depict the device 100 wherein the power rails 140H, 140L and the contacts 190P, 192P, 190N and 192N are all formed in the local interconnect level, i.e., in the insulating layer 182. In the embodiment shown in FIGS. 6C-6D, the power rails 140H, 140L are formed in the so-called "metal 1" layer in the layer of insulating material 184. As shown in FIG. 6C, a conductive structure 194P conductively couples the contacts 190P, 192P to the power rail 140H. As shown in FIG. 6D, a conductive structure 194N conductively couples the contacts 190N, 192N to the power rail 140L.

Figure 7A:
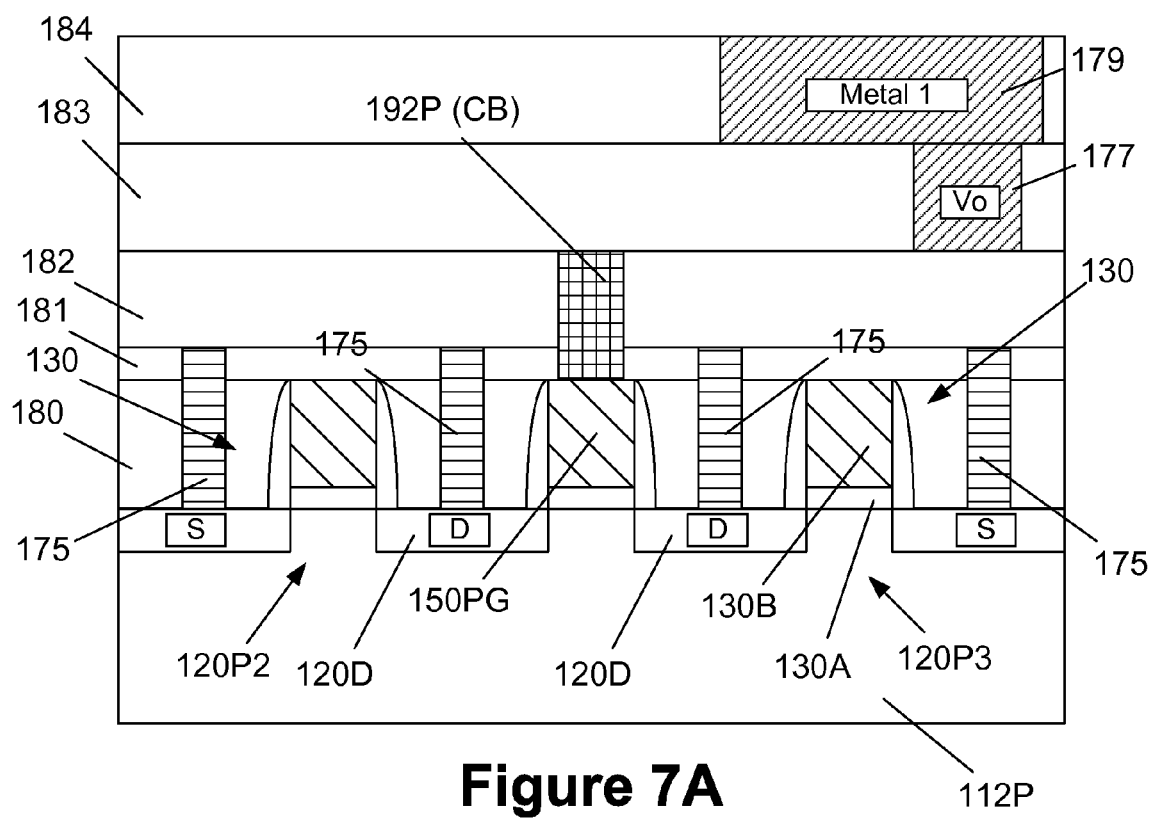
FIGS. 7A-7D are various cross-sectional views depicting yet another possible configuration of illustrative semiconductor devices disclosed herein.
Figure 7B:
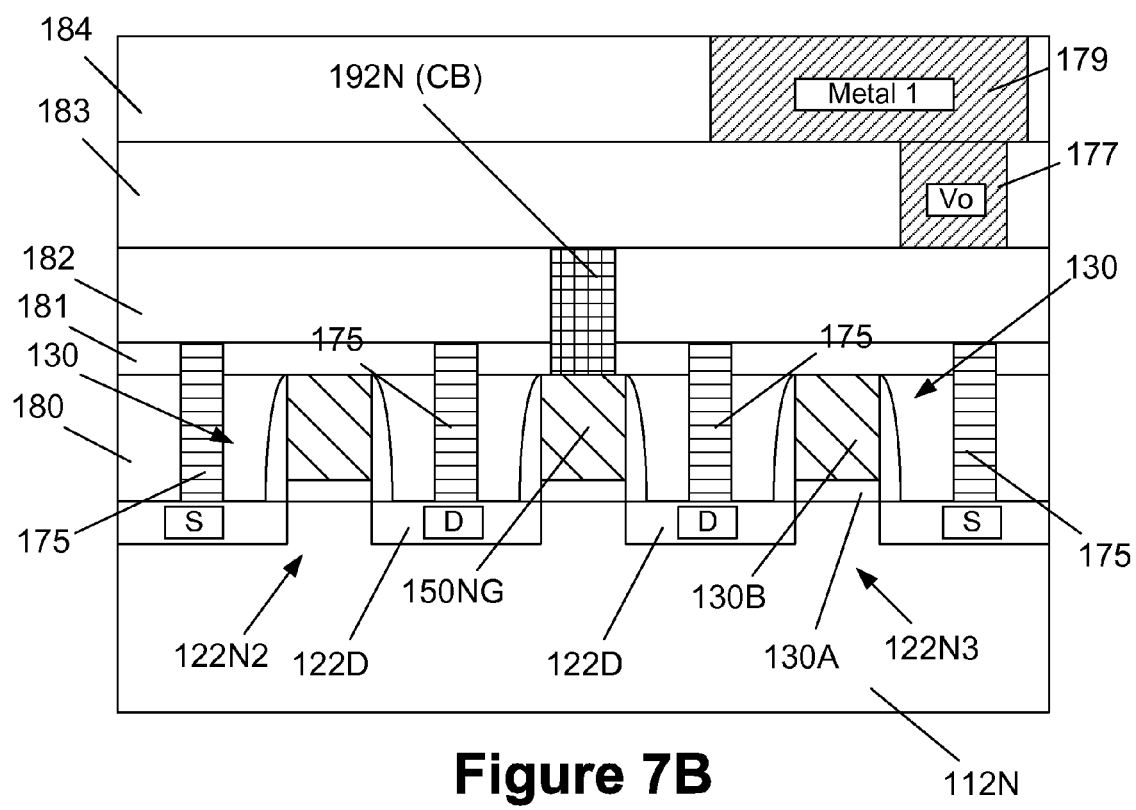
Figure 7C:
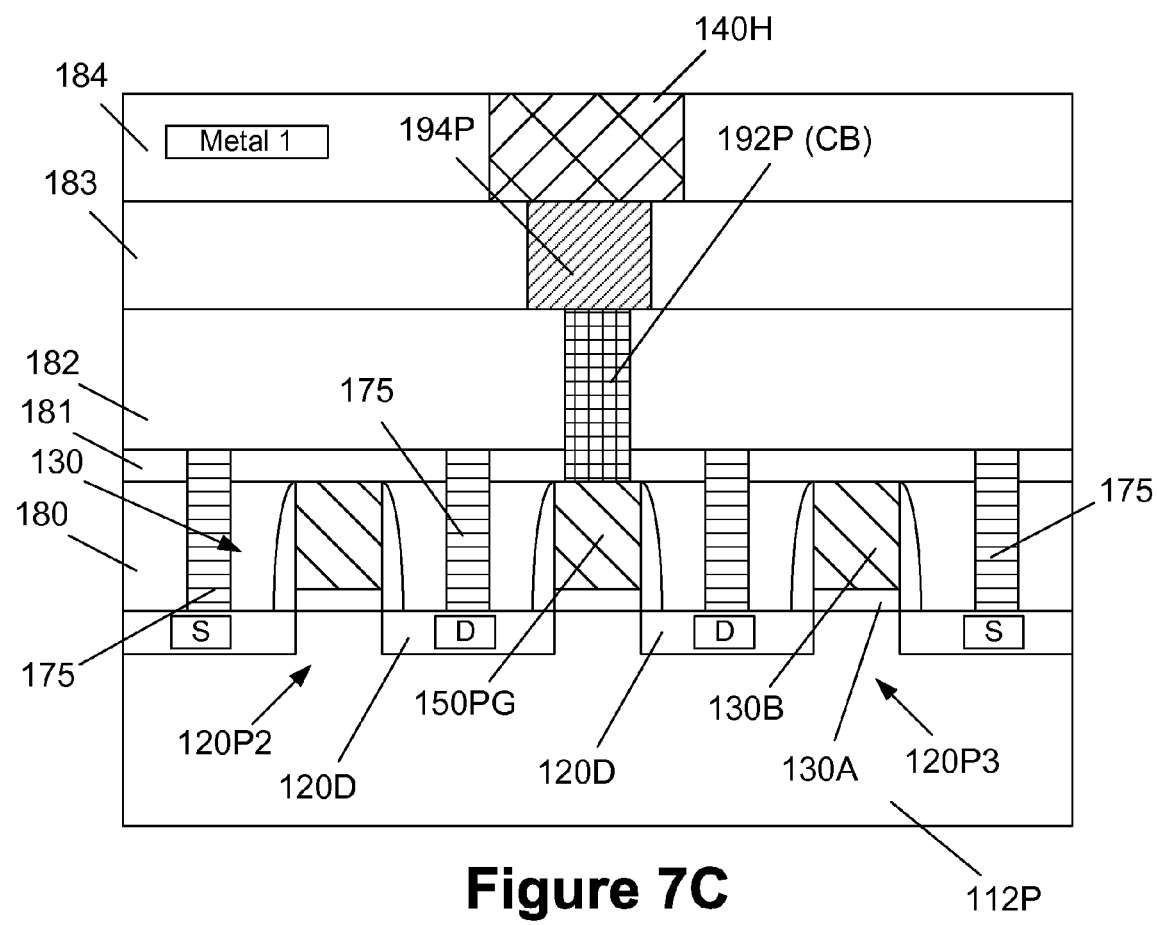
Figure 7D:
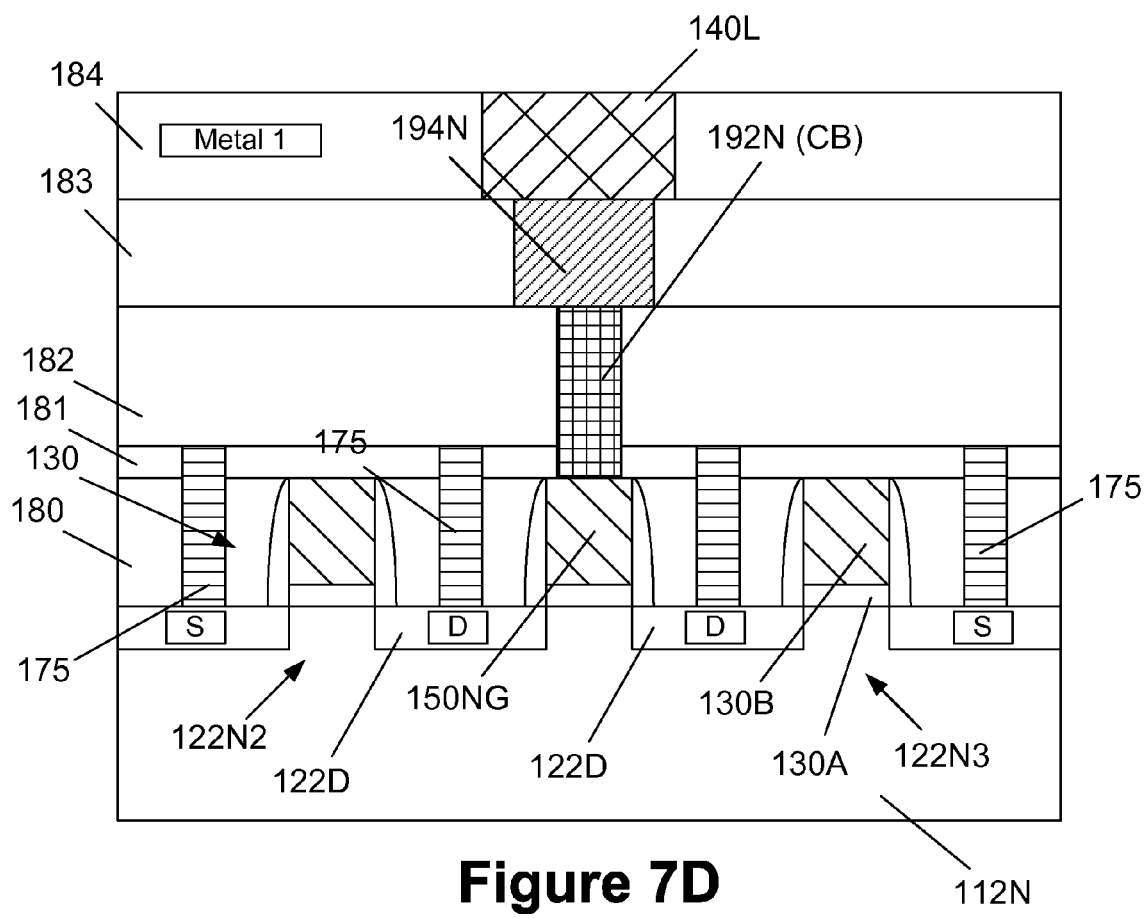

FIGS. 7A-7D depict further illustrative embodiments of various inventions disclosed herein. More specifically, FIGS. 7A and 7C depict the situation where the isolating electrode 150PG is positioned between the drain region 120D of the PFET device 120P2 and the drain region 120D of the PFET device 120P3, a configuration that corresponds to FIG. 4C. FIGS. 7B and 7D depict the situation where the isolating electrode 150NG is positioned between the drain region 122D of the NFET device 122N2 and the drain region 122D of the NFET device 122N3, a configuration that also corresponds to FIG. 4B. Note that, in FIGS. 7A-7D, only the isolating electrode 150PG is connected to the power rail 140H, and only the isolating electrode 150NG is connected to power rail 140L. As shown in FIG. 4C, the drain region 120D of the PFET transistor 120P3 and the drain region 122D of the NFET transistor 122N3 are coupled to one another by a conductive structure 148 (not shown in FIGS. 7A-7D), while the drain region 120D of the PFET transistor 120P2 and the drain region 122D of the NFET transistor 122N2 are coupled to one another by a conductive structure 149 (also not shown in FIGS. 7A-7D). FIGS. 7A-7B depict the device 100 wherein the power rails 140H, 140L and the contacts 192P and 192N are all formed in the local interconnect level, i.e., in the insulating layer 182. In the embodiment shown in FIGS. 7C-7D, the power rails 140H, 140L are formed in the so-called "metal 1" layer in the layer of insulating material 184. As shown in FIG. 7C, a conductive structure 194P conductively couples the contact 192P to the power rail 140H. As shown in FIG. 7D, a conductive structure 194N conductively couples the contact 192N to the power rail 140L.

In operation, applying a relatively high voltage to the isolating electrode 150PG via the power rail 140H electrically blocks or isolates the adjacent PFET transistors formed in the continuous active region 112P. Similarly, applying a relatively low voltage to the isolating electrode 150NG via the power rail 140L electrically blocks or isolates the adjacent NFET transistors formed in the continuous active region 112N. In CMOS technology, to reach conduction in a PMOS channel, the voltage applied to the gate of the PMOS device must be smaller than the voltage applied to the source by at least the threshold voltage of the PMOS device. When the applied voltage on the gate of the PMOS device is larger than the voltage applied to the source (or at least a voltage greater than the threshold of the transistor), the PMOS transistor is turned-off, meaning the active regions on both sides of the isolation electrode 150PG become electrically isolated. For an NMOS transistor, when the voltage applied on the gate of an NMOS device is greater than the voltage applied on the source by at least the threshold voltage of the NMOS device, a channel region is established under the gate that electrically connects the source and the drain of the NMOS device. By applying a voltage on the gate of the NMOS device that is less than the voltage applied to the source region (or at least lesser than the threshold voltage of the NMOS transistor), the NMOS transistor is turned-off, i.e., the active regions on both sides of the isolation electrode 150NG become electrically isolated.

In typical cell architecture, the minimum voltage or ground is used to bias the P-well body of the N-type CMOS transistors. The same minimum voltage can be applied to the N-side isolation electrode 150NG to effectively isolate the adjacent NMOS transistors. The maximum voltage is used to bias the N-well body of the P-type transistors in CMOS architecture. The same maximum voltage can be applied to the P-side isolation electrode 150PG to effectively isolate the adjacent PMOS transistors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
   a continuous active region defined in a semiconducting substrate;
   first and second transistors formed in and above said continuous active region, each of said first and second transistors comprising a plurality of doped regions formed in said continuous active region and a gate electrode;
   a conductive isolating electrode positioned above said continuous active region between said first and second transistors; and a power rail conductively coupled to said conductive isolating electrode.

2. The device of claim 1, wherein said first and second transistors are PFET transistors and wherein said power rail is adapted to be at a logically high voltage level.

3. The device of claim 1, wherein said first and second transistors are NFET transistors and wherein said power rail is adapted to be at a logically low voltage level.

4. The device of claim 1, wherein said conductive isolating electrode extends across an entirety of said continuous active region in a direction parallel to a gate width direction of said first and second transistors.

5. The device of claim 1, wherein said conductive isolating electrode comprises the same structure as said gate electrode of said first and second transistors.

6. The device of claim 1, further comprising a layer of insulating material positioned between said conductive isolating electrode and said continuous active region.

7. The device of claim 1, wherein said conductive isolating electrode is positioned above a space between adjacent doped regions of said first and second transistors.

8. The device of claim 7, wherein said adjacent doped regions are source regions of said first and second transistors.

9. The device of claim 7, wherein said adjacent doped regions are drain regions of said first and second transistors.

10. The device of claim 7, wherein said adjacent doped regions are a source region for one of said first and second transistors and a drain region for the other of said first and second transistors.

11. The device of claim 1, wherein said conductive isolating electrode is conductively coupled to said power rail by a conductive contact structure, and wherein said conductive contact structure and said power rail are positioned in the same layer of insulating material.

12. The device of claim 1, wherein said conductive isolating electrode is conductively coupled to said power rail by a conductive contact structure and wherein said conductive contact structure and said power rail are positioned at a level below a metal 1 wiring level of said device.

13. The device of claim 1, wherein said power rail is positioned in a metal 1 wiring level of said device.

14. A device, comprising:
first and second continuous active regions defined in a semiconducting substrate;
first and second PFET transistors formed in and above said first continuous active region, each of said first and second PFET transistors comprising a plurality of P-doped regions formed in said first continuous active region and a gate electrode;
first and second NFET transistors formed in and above said second continuous active region, each of said first and second NFET transistors comprising a plurality of N-doped regions formed in said second continuous active region and a gate electrode;
a first conductive isolating electrode positioned above said first continuous active region between said first and second PFET transistors;
a first power rail conductively coupled to said first conductive isolating electrode, wherein said first power rail is adapted to be at a logically high voltage level;
a second conductive isolating electrode positioned above said second continuous active region between said first and second NFET transistors; and
a second power rail conductively coupled to said second conductive isolating electrode, wherein said second power rail is adapted to be at a logically low voltage level.

15. The device of claim 14, wherein said first conductive isolating electrode extends across an entirety of said first continuous active region in a direction parallel to a gate width direction of said first and second PFET transistors and wherein said second conductive isolating electrode extends across an entirety of said second continuous active region in a direction parallel to a gate width direction of said first and second NFET transistors.

16. The device of claim 14, wherein each of said first and second conductive isolating electrodes have a long axis, and wherein the long axis of the first conductive isolating electrode is substantially aligned with the long axis of the second conductive isolating electrode.

17. The device of claim 14, wherein said first isolating gate electrode comprises the same structure as said gate electrode of said first and second PFET transistors.

18. The device of claim 17, wherein said second isolating gate electrode comprises the same structure as said gate electrode of said first and second NFET transistors.

19. The device of claim 14, further comprising a first layer of insulating material positioned between said first conductive isolating electrode and said first continuous active region.

20. The device of claim 19, further comprising a second layer of insulating material positioned between said second conductive isolating electrode and said second continuous active region.

21. The device of claim 14, wherein said first conductive isolating electrode is positioned above a space between adjacent P-doped regions of said first and second PFET transistors.

22. The device of claim 21, wherein said second conductive isolating electrode is positioned above a space between adjacent N-doped regions of said first and second NFET transistors.

23. The device of claim 14, wherein said first PFET transistor and said first NFET transistor share a first common gate electrode structure that extends across both of said first and second continuous active regions and an isolation region between said first and second continuous active regions.

24. The device of claim 23, wherein said second PFET transistor and said second NFET transistor share a second common gate electrode structure that extends across both of said first and second continuous active regions and said isolation region between said first and second continuous active regions.

25. The device of claim 14, wherein said first conductive isolating electrode is conductively coupled to said first power rail by a first conductive contact structure, and wherein said second conductive isolating electrode is conductively coupled to said second power rail by a second conductive contact structure, and wherein said first and second conductive contact structures and said first and second power rails are positioned in the same layer of insulating material.

26. The device of claim 14, wherein said first conductive isolating electrode is conductively coupled to said first power rail by a first conductive contact structure, and wherein said second conductive isolating electrode is conductively coupled to said second power rail by a second conductive contact structure, and wherein said first and second conductive contact structures and said first and second power rails are positioned at a level below a metal 1 wiring level of said device.

27. The device of claim 14, wherein said first and second power rails are positioned in a metal 1 wiring level of said device.

28. A device, comprising:
- first and second continuous active regions defined in a semiconducting substrate, said first and second continuous active regions being separated by an isolation region;
- first and second PFET transistors formed in and above said first continuous active region, each of said first and second PFET transistors comprising a plurality of P-doped regions formed in said first continuous active region;
- first and second NFET transistors formed in and above said second continuous active region, each of said first and second NFET transistors comprising a plurality of N-doped regions formed in said second continuous active region;
- a first common gate electrode structure shared by said first PFET transistor and said first NFET transistor, said first common gate electrode extending across both of said first and second continuous active regions and said isolation region;
- a second common gate electrode structure shared by said second PFET transistor and said second NFET transistor, said second common gate electrode extending across both of said first and second continuous active regions and said isolation region;
- a first conductive isolating electrode positioned above said first continuous active region above a space between adjacent P-doped regions of said first and second PFET transistors;
- a first power rail conductively coupled to said first conductive isolating electrode, wherein said first power rail is adapted to be at a logically high voltage level;
- a second conductive isolating electrode positioned above said second continuous active region above a space between adjacent N-doped regions of said first and second NFET transistors; and
- a second power rail conductively coupled to said second conductive isolating electrode, wherein said second power rail is adapted to be at a logically low voltage level.

29. The device of claim 28, wherein said first conductive isolating electrode extends across an entirety of said first continuous active region in a direction parallel to a gate width direction of said first and second PFET transistors and wherein said second conductive isolating electrode extends across an entirety of said second continuous active region in a direction parallel to a gate width direction of said first and second NFET transistors.

30. The device of claim 28, wherein each of said first and second conductive isolating electrodes have a long axis, and wherein the long axis of the first conductive isolating electrode is substantially aligned with the long axis of the second conductive isolating electrode.

31. The device of claim 28, wherein said first and second isolating gate electrodes comprise the same structure as said first and second common gate electrodes.

32. The device of claim 28, further comprising a first layer of insulating material positioned between said first conductive isolating electrode and said first continuous active region.

33. The device of claim 32, further comprising a second layer of insulating material positioned between said second conductive isolating electrode and said second continuous active region.

34. The device of claim 28, wherein said first conductive isolating electrode is conductively coupled to said first power rail by a first conductive contact structure, and wherein said second conductive isolating electrode is conductively coupled to said second power rail by a second conductive contact structure, and wherein said first and second conductive contact structures and said first and second power rails are positioned in the same layer of insulating material.

35. The device of claim 28, wherein said first conductive isolating electrode is conductively coupled to said first power rail by a first conductive contact structure, and wherein said second conductive isolating electrode is conductively coupled to said second power rail by a second conductive contact structure, and wherein said first and second conductive contact structures and said first and second power rails are positioned at a level below a metal 1 wiring level of said device.

36. The device of claim 28, wherein said first and second power rails are positioned in a metal 1 wiring level of said device.

* * * * *